(12) United States Patent
Tsuchida et al.

(10) Patent No.: US 7,102,945 B2
(45) Date of Patent: Sep. 5, 2006

(54) READ CIRCUIT OF SEMICONDUCTOR AND READ METHOD USING A SELF-REFERENCE SENSING TECHNIQUE

(75) Inventors: Kenji Tsuchida, Kawasaki (JP); Junichi Miyamoto, Yokohama (JP); Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/014,862

(22) Filed: Dec. 20, 2004

(65) Prior Publication Data
US 2006/0092734 A1   May 4, 2006

(30) Foreign Application Priority Data
Oct. 29, 2004  (JP) .............................. 2004-316282

(51) Int. Cl.
*G11C 7/00* (2006.01)
(52) U.S. Cl. .................. 365/205; 365/203; 365/189.09
(58) Field of Classification Search ...................... None
See application file for complete search history.

(56) References Cited

U.S. PATENT DOCUMENTS 6,075,734 A * 6/2000 Jang ........................... 365/203
6,545,906 B1   4/2003 Savtchenko et al.

OTHER PUBLICATIONS

Noboru Sakimura, et al., "A 512Kb Cross-Point Cell MRAM", 2003 IEEE International Solid-State Circuits Conference, Paper 16.1, 2003.
Gitae Jeong, et al., "A 0.24μM 2.0V 1T1MTJ 16kb NV Magnetoresistance RAM with Self Reference Sensing", 2003 IEEE International Solid-State Circuits Conference, Paper 16.2, 2003.

* cited by examiner

*Primary Examiner*—David Lam
(74) *Attorney, Agent, or Firm*—Oblon, Spivak, McClelland, Maier & Neustadt, P.C.

(57) ABSTRACT

A read circuit of a semiconductor memory according to the present invention is based on a self-reference sensing technique by which data stored in a memory cell is determined by first and second signals read out from a memory cell through first and second read operations. This read circuit includes a sense amplifier which determines the data stored in the memory cell based on a potential of an input node, a transfer transistor which is connected between the memory cell and the input node, a precharge circuit which sets the input node to a precharge potential, and a VBIAS generator which turns the transfer transistor cutoff based on the first signal.

20 Claims, 12 Drawing Sheets

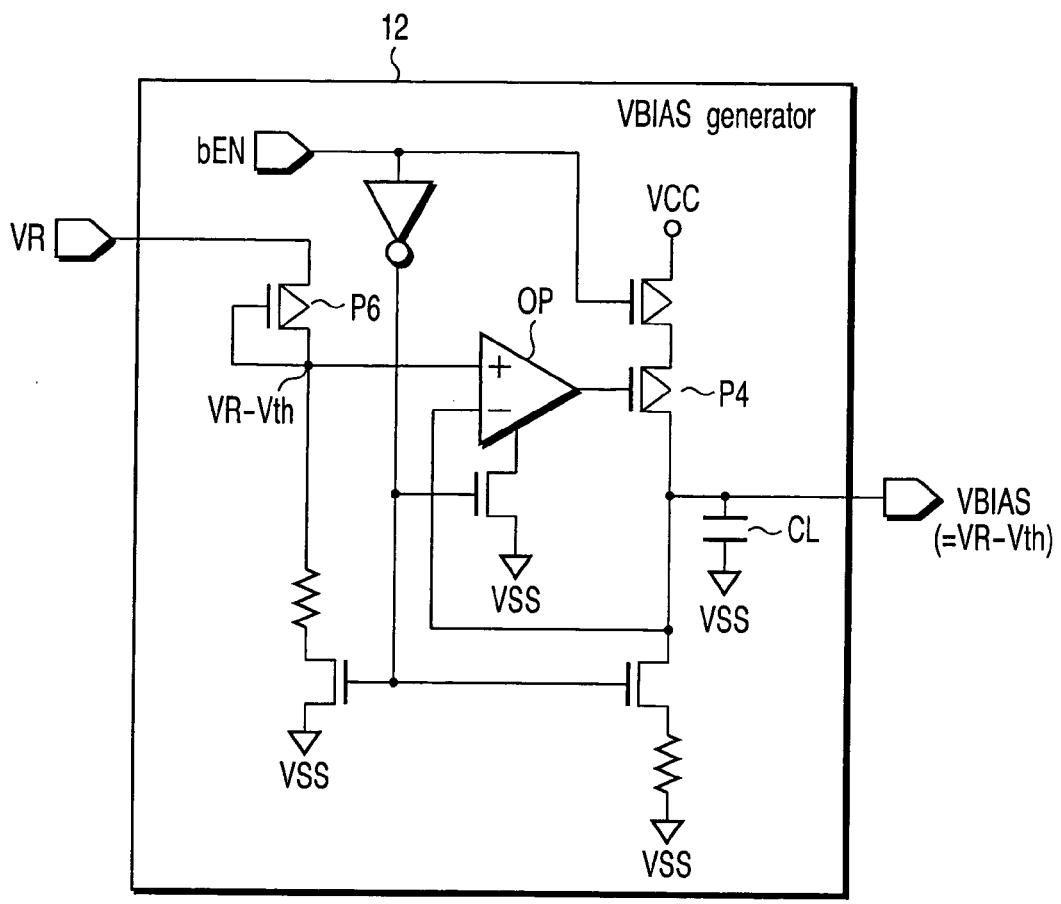
F I G. 12
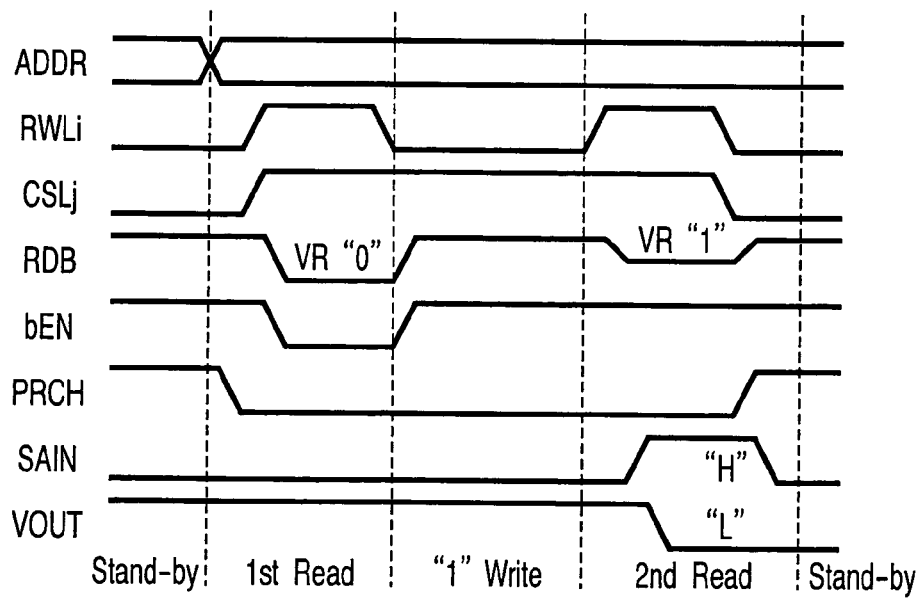
F I G. 13

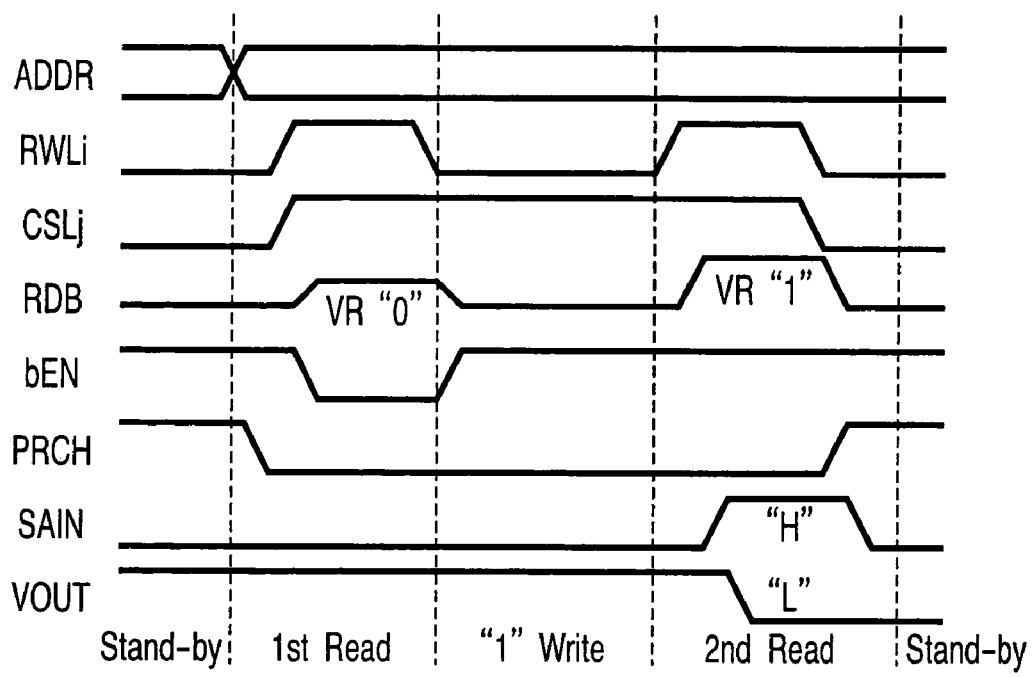
F I G. 17
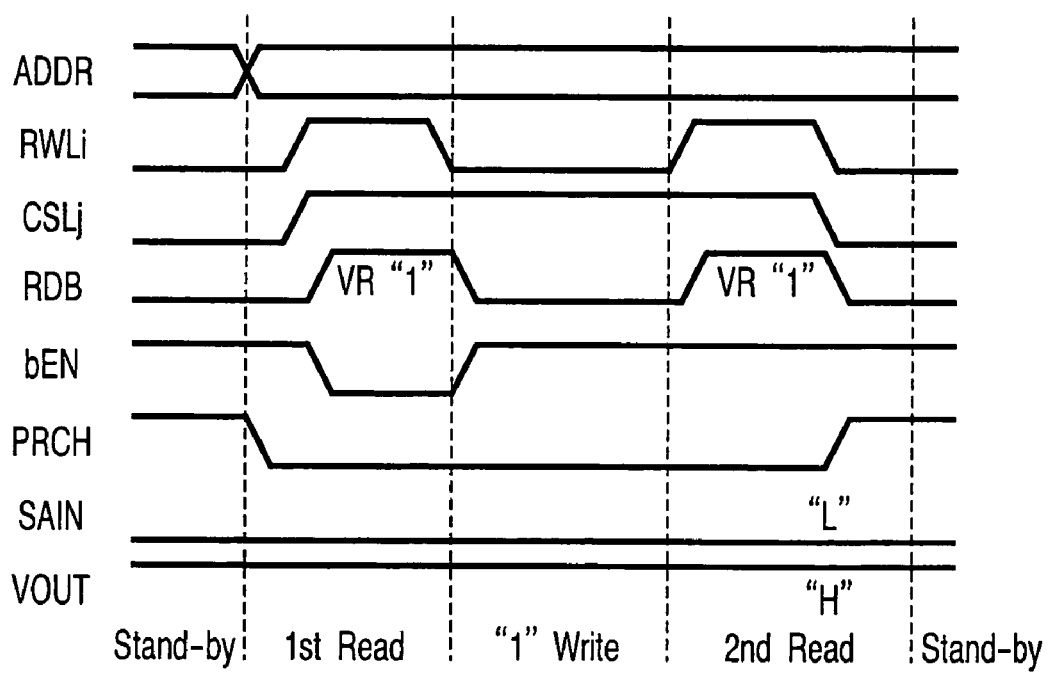
F I G. 18

READ CIRCUIT OF SEMICONDUCTOR AND READ METHOD USING A SELF-REFERENCE SENSING TECHNIQUE

CROSS-REFERENCE TO RELATED APPLICATIONS

This application is based upon and claims the benefit of priority from prior Japanese Patent Application No. 2004-316282, filed Oct. 29, 2004, the entire contents of which are incorporated herein by reference.

BACKGROUND OF THE INVENTION

1. Field of the Invention

The present invention relates to a read circuit and a read method using a self-reference sensing technique that are employed particularly in a magnetic random access memory (MRAM) utilizing the magnetoresistive effect.

2. Description of the Related Art

A magnetic random access memory is a memory device that includes magnetoresistive devices as memory cells. Despite being a nonvolatile memory, a magnetic random access memory exhibits high integration, high reliability, low power consumption, and high-speed performance. Therefore, such a magnetic random access memory is expected to be one of the next-generation memory devices.

The magnetoresistive effects are divided into two types: GMR (giant magnetoresistive) effect and TMR (tunneling magnetoresistive) effect.

The "GMR effect" is the phenomenon that causes the resistance of a conductor interposed between two ferromagnetic layers to vary with the spin directions of the two ferromagnetic layers. However, the MR (magnetoresistive) ratio representing the varying ratio of the magnetic resistance with the GMR effect is as low as 10%, and accordingly, read signals become very small.

Therefore, to realize a magnetic random access memory utilizing the GMR effect, it is necessary to secure great read margins. In reality, however, great read margins are not easily secured, and for this reason, a magnetic random access memory utilizing the GMR effect is considered to be inadequate for practical use.

The "TMR effect" is the phenomenon that causes the junction resistance of a ferromagnetic tunnel junction formed with two ferromagnetic layers and an insulating layer (a tunnel barrier layer) interposed between the two ferromagnetic layers, i.e., the tunnel conductance of the insulating layer, to vary with the cosine of the relative angle of the magnetization of the two ferromagnetic layers.

Typical examples using the TMR effect include MTJ (magnetic tunnel junction) devices using magnetoresistance variations caused by a spin-deflecting tunneling effect. In a MTJ device, the tunnel probability becomes the highest and the junction resistance of the ferromagnetic tunnel junction becomes the smallest, if the spin directions of the two ferromagnetic layers are the same (or parallel to each other). If the spin directions of the two ferromagnetic layers are opposite to each other (or anti-parallel to each other), the tunneling probability becomes the lowest and the junction resistance of the ferromagnetic tunnel junction becomes the greatest.

To arbitrarily put the spin directions in one of the above two states, one of the two ferromagnetic layers is normally fixed in one direction of magnetization and serves as a pin layer (a fixed layer) that is not affected by an external magnetic field. Meanwhile, the other one of the two ferromagnetic layers is designed to be a free layer (a memory layer) that can have a magnetizing direction made parallel or anti-parallel to the direction of magnetization of the pin layer in the existence of an external magnetic field. With the TMR effect, the MR ratio that represents the varying ratio of a magnetoresistance can be made 50% or higher, and thus, reliable read operations can be performed.

Accordingly, magnetoresistive devices utilizing the TMR effect are normally employed in the development of magnetic random access memories at present.

Meanwhile, a self-reference sensing technique has been developed for use in magnetic random access memories, so as to achieve reliable read operations that are not adversely affected by variations in the characteristics of memory cells (see "0.24 μm 2.0V 1T1MTJ 16 Kb NV Magnetoresistive RAM with Self Reference Sensing", ISSCC Digest of Technical Papers, 2003).

This technique is characterized in that two read operations are performed on a designated cell to be read, and the value of the data stored in the designated cell is determined by comparing the data read through the two read operations.

For example, after the first read operation is performed on the designated cell, "0" is written in the designated cell, and the second read operation is then performed on the designated cell. If the data (signal) read out through the two read operations are the same, the value of the data stored in the designated cell is determined to be "0". If the data read out through the two read operations differ from each other, the value of the data stored in the designated cell is determined to be "1".

The determination of the value of the data stored in the designated cell is performed by detecting the difference between the signal obtained through the two read operations. For example, a read current I1 is applied to the designated cell in the first read operation, and a read current I2 (>I1) is applied to the designated cell in the second read operation.

By the conventional self-reference sensing technique, however, each of the margins allowed for the "0"/"1" determination to be performed by an operational amplifier is as small as half of the greatest signal difference obtained with the MR ratio of the corresponding magnetoresistive device.

Only such small margins are allowed, because guard bands or offsets (the read currents I1 and I2) need to be set so as to determine whether there is not a difference between the signal obtained through the two read operations (whether the data values are the same). Therefore, there is an increasing demand for a technique to eliminate this drawback.

BRIEF SUMMARY OF THE INVENTION

A read circuit of a semiconductor memory according to an aspect of the present invention comprises: a sense amplifier which determines data stored in a memory cell based on a potential of an input node; a transfer transistor which is connected between the memory cell and the input node; a precharge circuit which sets the input node to a precharge potential; and a VBIAS generator which turns the transfer transistor cutoff based on a first signal obtained from the memory cell through a first read operation, wherein the transfer transistor is turned on state when a second signal obtained from the memory cell through a second read operation differs from the first signal.

A read method using a self-reference sensing technique according to an aspect of the present invention comprises: setting an input node of a sense amplifier to a precharge potential; turning a transfer transistor cutoff based on a first signal obtained from a memory cell through a first read operation, the transfer transistor being connected between the memory and the input node; and turning the transfer transistor on and changing the potential of the input node from the precharge potential when a second signal obtained from the memory cell through a second read operation differs from the first signal.

BRIEF DESCRIPTION OF THE SEVERAL VIEWS OF THE DRAWING

FIG. 12 is a circuit diagram illustrating an example of a VBIAS generator;

FIG. 13 is a waveform chart showing the operation timings of the read circuit of FIG. 11;

FIG. 17 is a waveform chart showing the operation timings of the read circuit of FIG. 16;

FIG. 18 is another waveform chart showing the operation timings of the read circuit of FIG. 16.

DETAILED DESCRIPTION OF THE INVENTION

A read circuit of a semiconductor memory of an aspect of the present invention will be described below in detail, with reference to the accompanying drawings.

1. Self-Reference Sensing Technique

First, a self-reference sensing technique on which an aspect of the present invention is based will be described in detail.

The self-reference sensing technique is a sensing technique that involves the four steps of "first read", "write", "second read", and "rewrite". According to the self-reference sensing technique, data read out through the first read operation and the second read operation are compared with each other, to determine the value of the data stored in a designated cell.

For example, after the first read operation is performed on the designated cell, "0" is written in the designated cell, and the second read is performed on the designated cell. If the data (a signal) read out through the second read operation is the same as the data read out through the first read operation, the value of the data stored in the designated cell is determined to be "0". If the data read out through the second read operation differs from the data read out through the first read operation, the value of the data stored in the designated cell is determined to be "1".

According to the self-reference sensing technique, even if there are variations in the characteristics of memory cells, the margins allowed for "0"/"1" determination to be performed by a sense amplifier (an operational amplifier, for example) do not vary with the characteristics variations. Accordingly, the greatest margins (each being equal to half of the greatest signal difference obtained from the memory cells) can be constantly maintained, and reliable read operations can be performed. In particular, applying the self-reference sensing technique to magnetic random access memories is being considered, because variations are easily caused in the cell resistance due to the variations in the thickness of the tunnel barrier layer among magnetoresistive devices.

With this technique, however, there is a problem in that each of the margins allowed for the "0"/"1" determination to be performed by the sense amplifier is only equivalent to half of the greatest signal difference obtained from the memory cells, because guard bands or offsets (read currents I1 and I2) need to be set so as to determine whether there is not a difference between the signals obtained through the two read operations (whether the data values are the same).

Figure 1:
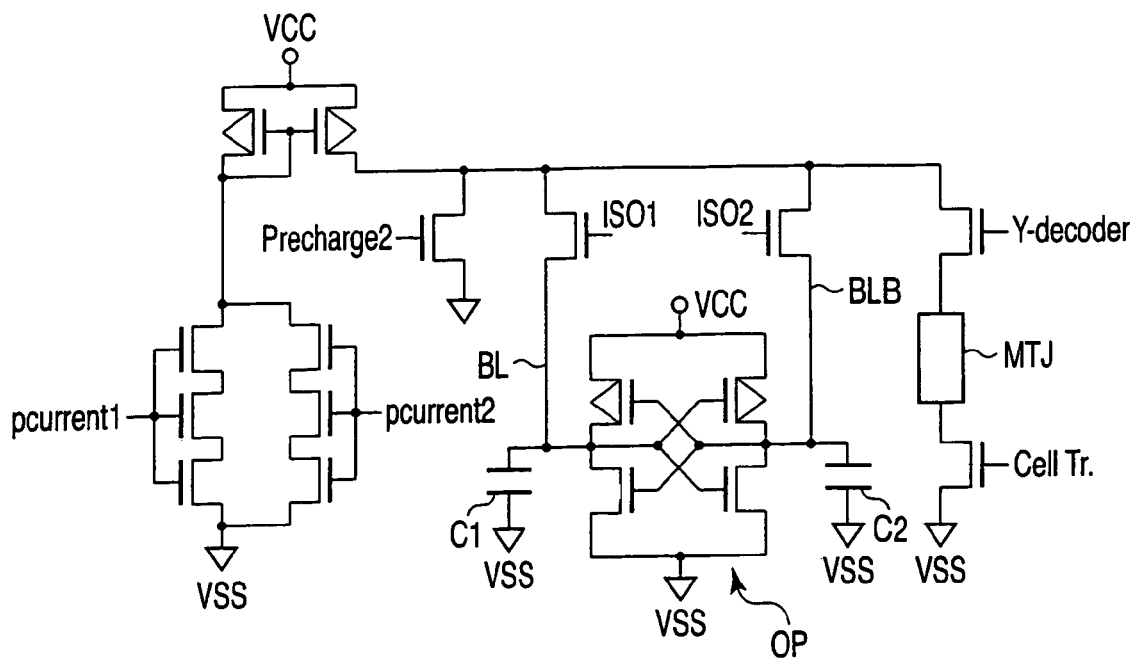
FIG. 1 is a circuit diagram illustrating an example of a read circuit according to a self-reference sensing technique.

FIG. 1 illustrates an example of a read circuit of a magnetic random access memory utilizing the self-reference sensing technique.

In this read circuit, the read current I1 to be applied to a designated cell to be read in the first read operation is determined by the gate width of an N-channel MOS transistor to which a control signal "pcurrent1" is input through the gate. The read current I2 to be applied to the designated cell in the second read operation is determined by the total of the gate width of the N-channel MOS transistor to which the control signal "pcurrent1" is input through the gate and the gate width of an N-channel MOS transistor to which a control signal "pcurrent2" is input through the gate. Here, the relationship between the read currents I1 and I2 is expressed as I2>I1.

In this case, the first read operation is performed, with a control signal ISO1 being set "H" and a control signal ISO2 being set "L". If the data stored in the designated cell (magnetoresistive device) MTJ is "0" (the cell resistance being Rp), the signal (voltage) VBL obtained from the designated cell MTJ is I1×Rp and is accumulated in a capacitor C1 via a bit line BL.

If the data stored in the designated cell MTJ is "1" (the cell resistance being Rp(1+MR)), the signal (voltage) VBL obtained from the designated cell MTJ is I1×Rp(1+MR) and is accumulated in the capacitor C1 via the bit line BL.

Thereafter, for example, "0" is written in the designated cell MTJ.

The second read operation is then performed, with the control signal ISO1 being set "L" and the control signal ISO2 being set "H". As a result, the signal (voltage) VBLB obtained from the designated cell (magnetoresistive device)

MTJ is I2×Rp, regardless of the value of the data stored in the designated cell MTJ. The signal is accumulated in a capacitor C2 via a bit line BLB.

Accordingly, in the case where the data stored in the designated cell MTJ is "0", the difference ΔVSA0 between the signals obtained through the two read operations is expressed as:

$$\Delta VSA0 = VBLB - VBL \quad (1)$$
$$= Rp \times (I2 - I1)$$

where VBLB is greater than VBL (VBLB>VBL).

In the case where the data stored in the designated cell MTJ is "1", the difference ΔVSA1 between the signals obtained through the two read operations is expressed as:

$$\Delta VSA1 = VBL - VBLB \quad (2)$$
$$Rp((1 + MR) \times I1 - I2)$$

where VBLB is smaller than VBL (VBLB<VBL), and MR represents the MR ratio of the designated cell MTJ.

Figure 2:
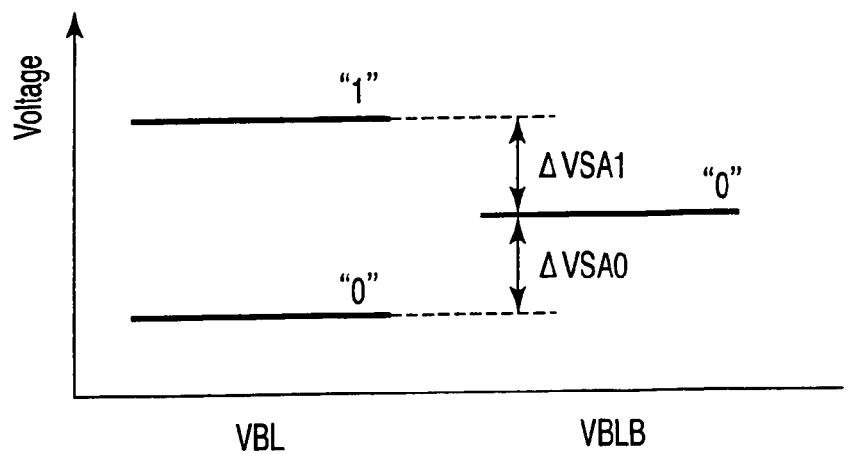
FIG. 2 shows the margins allowed for "0"/"1" determination to be performed by an operational amplifier of FIG. 1.

As shown in FIG. 2, if the data stored in the designated cell MTJ is "0", VBLB is greater than VBL, and, if "1", VBLB is smaller than VBL.

Accordingly, the value of the data stored in the designated cell MTJ can be determined by an operational amplifier OP detecting the signal difference ΔVSA0 or ΔVSA1.

More specifically, when the data stored in the designated cell MTJ is "0", VBLB is greater than VBL, and therefore, the potential difference between the bit lines BL and BLB is amplified to set the level of the bit line BL to "L" and the level of the bit line BLB to "H". When the data stored in the designated cell MTJ is "1", VBLB is smaller than VBL, and therefore, the potential difference between the bit lines BL and BLB is amplified to set the level of the bit line BL to "H" and the level of the bit line BLB to "L".

In this case, the margins allowed for the "0"/"1" determination to be performed by the operational amplifier are made uniform, so as to achieve high reliability in read operations.

Accordingly, as the differences ΔVSA0 and ΔVSA1 are made equal to each other, the relationship between the read currents I1 and I2 in the first and second read operations is expressed as:

$$I2 = (1 + MR/2) \times I1 \quad (3)$$

Based on the equations (1), (2) and (3), the following expression is established:

$$\Delta VSA0 = \Delta VSA1 = Rp(MR/2) \quad (4)$$

As is apparent from the expression (4), by the conventional self-reference sensing technique, each of the margins allowed for the "0"/"1" determination to be performed by the operational amplifier is equal to only half of the greatest signal difference obtained with the MR ratio of the corresponding magnetoresistive device.

These smaller margins are due to the provision of guard bands that is characteristic of the conventional self-reference sensing technique.

If the provision of the guard bands can be omitted, the margins allowed for the "0"/"1" determination to be performed by the operational amplifier in read operations according to a self-reference sensing technique can be made great enough to realize highly reliable read operations, without an adverse influence of the MR ratio of the magnetoresistive device.

Also, the omission of the guard bands makes the read currents to be used in the two read operations equal to each other. As a result, the switching of the read currents becomes unnecessary, and read operations can be performed at a higher speed.

2. Principles

The self-reference sensing technique according to an aspect of the present invention is characterized by the omission of the guard bands that have been necessary in determining whether the data values obtained from the designated cell through the two read operations are the same according to the prior art.

To realize the omission of the guard bands, a transfer transistor is provided between a read data bus and a sense amplifier, and the operation of this transfer transistor is controlled by a VBIAS generator according to the present invention.

More specifically, a read current is applied to the designated cell in the first read operation. Here, the VBIAS generator controls the gate potential of the transfer transistor so that the transfer transistor is constantly cutoff, regardless of the value of the data stored in the designated cell. After that, "0" write is performed, and the second read operation is performed. Meanwhile, the transfer transistor is maintained cutoff until the second read operation.

In the second read operation, a read current that is the same as the read current used in the first read operation is applied to the designated cell. The transfer transistor is maintained cutoff only if the value of the data stored in the designated cell is unchanged before and after the write operation. If the value of the data stored in the designated cell is changed, the transfer transistor is switched from cutoff to on.

Therefore, the read data input node SAIN of the sense amplifier is precharged to a precharge potential VPR (a supply potential VCC, for example) in the first read operation. If the value of the data read out from the designated cell is unchanged before and after the write operation, the input node SAIN is maintained at the precharge potential VPR. If the value of the data read out from the designated cell is changed, the input node SAIN is reduced from the precharge potential VPR to a read potential (a signal) VR read out into the read data bus.

With this configuration, the provision of the guard bands can be omitted from a semiconductor memory utilizing a self-reference sensing technique, and highly reliable read operations can be performed at high speed.

As it becomes possible to determine whether the data read out from the designated cell is unchanged before and after the write operation without the provision of the guard bands, the margins allowed for the "0"/"1" determination to be performed by the sense amplifier can be made as great as the largest signal difference obtained with the MR ratio of the corresponding magnetoresistive device in a magnetic random access memory, regardless of variations in the MR ratio.

Compared with a magnetic random access memory utilizing the conventional self-reference sensing technique, the above magnetic random access memory is much more advantageous in practical use, because it is possible to secure a read signal twice as large or even larger.

Furthermore, with a read circuit according to the present invention, an operation utilizing a novel self-reference sensing technique can be realized.

More specifically, the write operation to be performed between the first and second read operations according to the conventional self-reference sensing technique is omitted according to the present invention. Instead, the second read operation is performed while a uniaxial magnetic direction is applied to the designated cell. In this manner, the difference between the resistances of the designated cell in the first and second read operations is detected to determine the data stored in the designated cell.

In this operation utilizing the novel self-reference sensing technique, the number of steps can be reduced from the conventional four ("first read", "write", "second read", and "rewrite") to two ("first read" and "second read with a magnetic field being applied").

In addition to the omission of the write operation, the rewrite step to be performed on the designated cell after the determination of the data stored in the designated cell can also be omitted, because the data stored in the designated cell is not destroyed in the read operations according to the self-reference sensing technique of the present invention. Thus, a magnetic random access memory that excels in speed in read operations can be achieved.

The self-reference sensing technique according to the present invention and the read circuit utilizing the technique according to the present invention may be applied not only to a magnetic random access memory but also to any semiconductor memory that is required to exhibit high reliability and high-speed performance.

Where the present invention is applied to a magnetic random access memory, the write method employed in the magnetic random access memory does not affect the read operations according to the present invention.

For example, the present invention can be applied to a magnetic random access memory that employs a uniaxial write method using magnetic fields directed only in a certain axial direction, a biaxial write method using magnetic fields directed in two axial directions, or a triaxial write method using magnetic fields directed in three axial directions. The present invention is also compatible with the toggle write method (see "A 4 Mbit 0.18 µm 1T1MTJ "Toggle" MRAM Memory", ISSCC Digest of Technical Papers, 2004).

3. Embodiments

The following is a description of most preferable embodiments of the present invention.

(1) First Embodiment

A. Read Circuit

Figure 3:
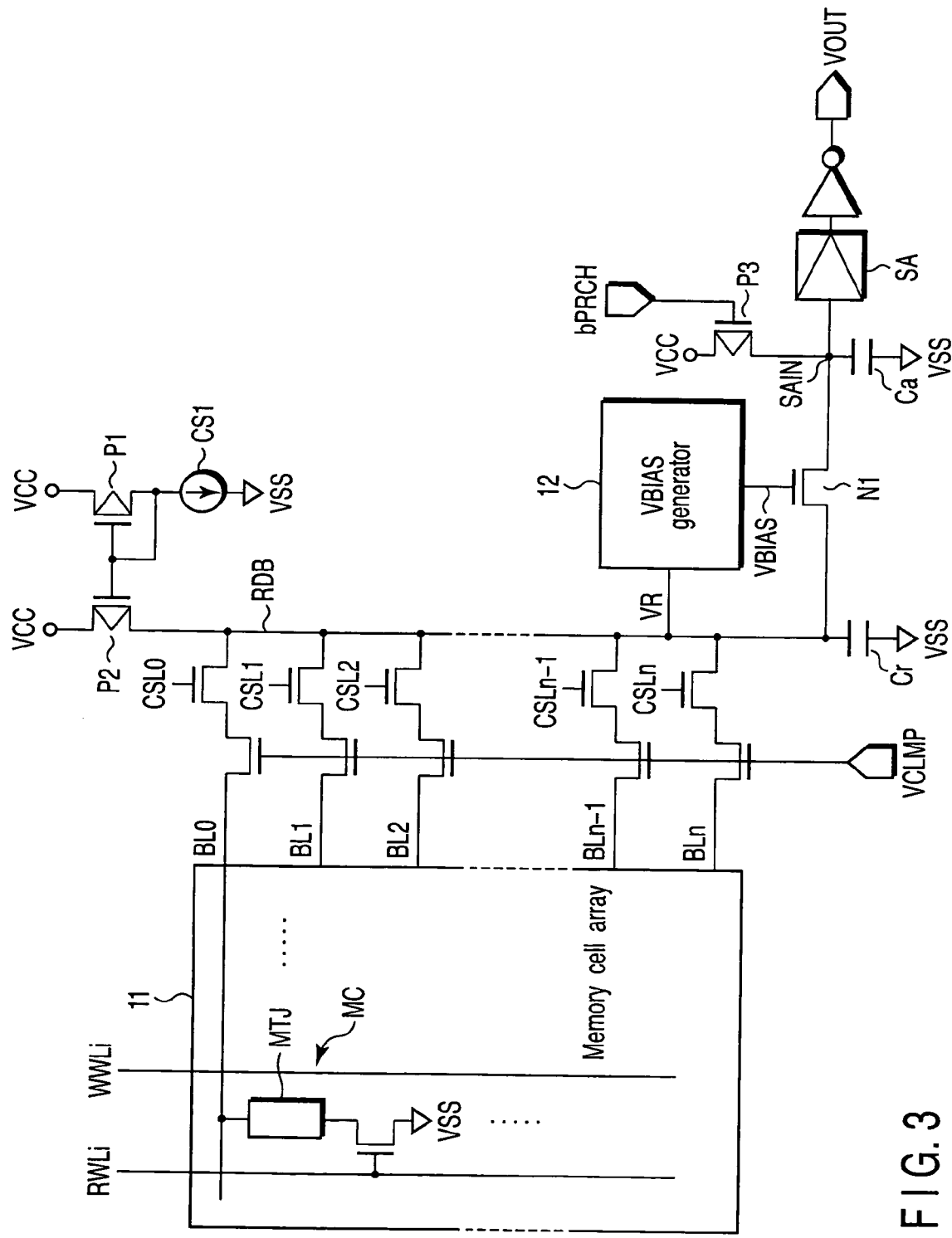
FIG. 3 is a circuit diagram illustrating a read circuit according to a first embodiment of the present invention.

FIG. 3 illustrates a read circuit of a magnetic random access memory according to a first embodiment of the present invention.

A memory cell array 11 includes memory cells MC that are arranged in an array. The memory cells MC may be two-dimensionally or three-dimensionally arranged on a semiconductor substrate. Each of the memory cells MC includes a MTJ device (a magnetoresistive device) MTJ.

In this embodiment, each of the memory cells MC is of the 1TR-1MTJ type that includes a transistor and a MTJ device. However, the memory cells MC are not limited to this type.

A read word line RWLi is connected to the gate of the read selecting transistor of the memory cells MC, and a bit line BLj (j=0, 1, 2, ... n-1, n) is connected to one end of the MTJ device of each memory cell MC.

When the read word line RWLi is activated and becomes "H" at the time of a read operation, for example, all the data stored in the memory cells MC in the single row connected to the read word line RWLi are read out to the bit lines BLj (j=0, 1, 2, ... n-1, n).

When one of column selecting lines CSLj (j=0, 1, 2, ... n-1, n) is selectively activated, only the data stored in the memory cell (designated cell) MC selected to be read are transferred to a read data bus RDB.

The N-channel MOS transistors each having a clamp signal VCLMP input to its gate are clamping circuits that clamp the respective bit lines BLj (j=0, 1, 2, ... n-1, n) at a constant voltage.

The clamping circuits clamp the respective bit lines BLj (j=0, 1, 2, ... n-1, n) at a constant voltage at the time of a read operation, so as to reduce the bias dependency exhibited in such a manner that the MR ratio of each MTJ device varies with the bias voltage applied to the MTJ device. With the bias dependency being reduced, variations in the read margin among the memory cells MC are restricted.

A constant current circuit is connected to one end of the read data bus RDB. The constant current circuit includes a constant current source CS1 that generates a constant current I, and a current mirror circuit that reads and copies the constant current I, and supplies the copy current to the read data bus RDB. The current mirror circuit includes P-channel MOS transistors P1 and P2.

At the time of a read operation, the constant current I as a read current flows from the constant current circuit to the selected memory cell MC. Here, the data stored in the selected memory cell MC, or the read potential (signal) VR corresponding to the magnetoresistance of the MTJ device of the selected memory cell MC, is read out to the read data bus RDB.

In this embodiment, the read data bus RDB is shared among the bit lines BLj (j=0, 1, 2, ... n-1, n). The capacitance Cr represents the parasitic capacitance caused in the read data bus RDB, such as the line capacitance and the diffusion capacitance of column switches each having a gate connected to the corresponding column selecting line CSLj (j=0, 1, 2, ... n-1, n).

A sensing circuit is connected to the other end of the read data bus RDB. This embodiment is characterized in that a transfer transistor N1 is connected between the read data bus RDB and a sense amplifier SA.

In this embodiment, the transfer transistor N1 is formed with an N-channel MOS transistor that has a gate connected to a VBIAS generator 12.

Based on the read potential VR read into the read data bus RDB in a first read operation, the VBIAS generator 12 sets the gate of the transfer transistor N1 at VBIAS (=VR+Vth), thereby putting the transfer transistor N1 cutoff. Here, Vth represents the threshold voltage of the transfer transistor N1.

The source of the transfer transistor N1 is connected to the read data bus RDB, while the drain of the transfer transistor N1 is connected to the read data input node SAIN of the sense amplifier SA. Further, a P-channel MOS transistor P3 is connected to the input node SAIN. The P-channel MOS transistor P3 serves as a precharge circuit that precharges the input node SAIN to a precharge potential VPR (a supply potential VCC, for example) during a standby mode.

An inversion signal bPRCH of a precharge signal PRCH is input to the gate of the P-channel MOS transistor P3. When the inversion signal bPRCH of the precharge signal PRCH becomes "L", the P-channel MOS transistor P3 is turned on, and the input node SAIN is precharged to the precharge potential VPR.

Figure 4:
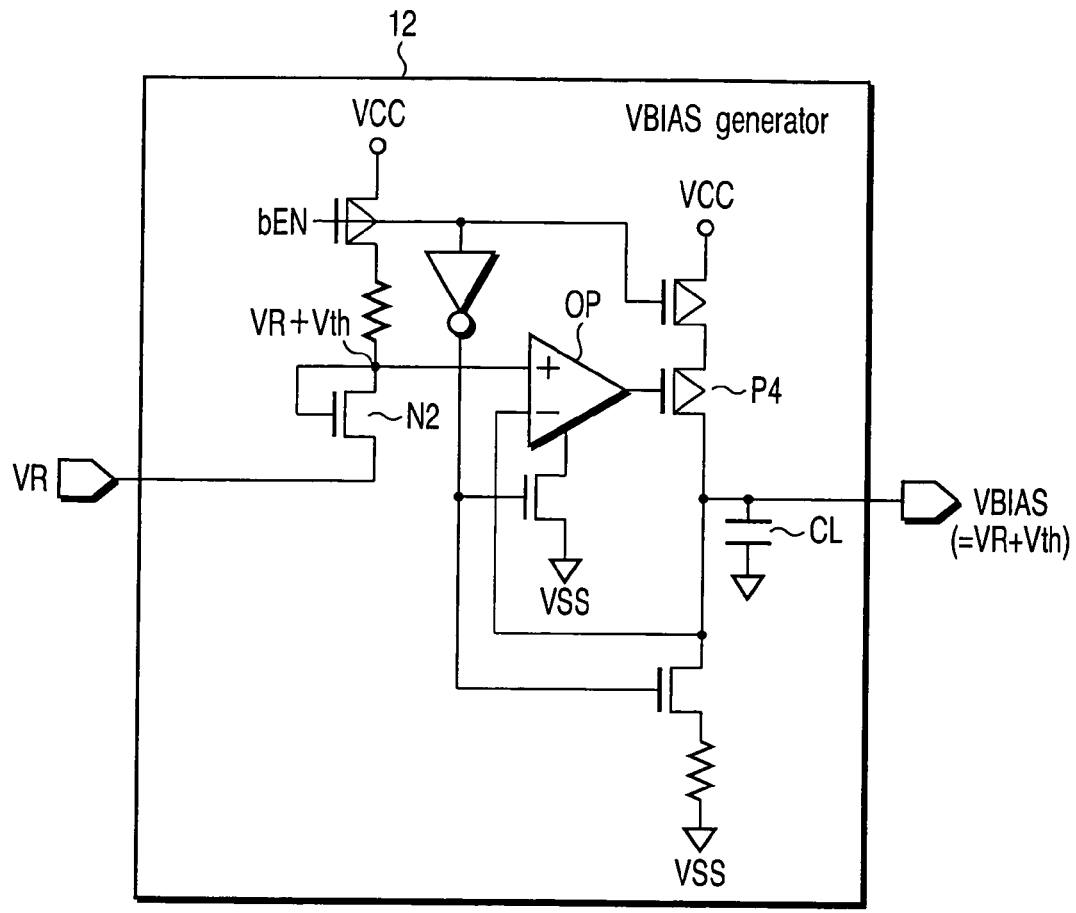
FIG. 4 is a circuit diagram illustrating an example of a VBIAS generator 12.

FIG. 4 illustrates an example of the circuit configuration of the VBIAS generator 12 of the read circuit shown in FIG. 3.

The VBIAS generator 12 of this embodiment has a function of generating a bias potential VBIAS to turn the transfer transistor N1 shown in FIG. 3 cutoff, based on the read potential VR read out from the selected memory cell into the read data bus RDB.

In the first read operation, the VBIAS generator 12 invariably turns the transfer transistor N1 cutoff, even if there is a variation in the cell resistance among the memory cells that store identical data, and as a result, a difference is caused in the read potential VR to be read out from the memory cells storing the identical data to the read data bus RDB.

This operation is performed in the following manner.

When the first read operation is to be performed, the inversion signal bEN of an enable signal EN that is an activation signal for the VBIAS generator 12 is first turned "L". At this point, the VBIAS generator 12 is put in an operating state with the supply potential VCC.

As the first read operation is performed and the read data bus RDB has the read potential VR, a reference potential is input to the positive input node of an operational amplifier OP. The reference potential is a value (VR+Vth) obtained by adding the threshold voltage Vth of an N-channel MOS transistor N2 to the read potential VR.

Here, the read potential VR is expressed as Rp×I when the data stored in the selected memory cell is "0", and is expressed as Rp(1+MR)×I when the data stored in the selected memory cell is "1". In those expressions, Rp represents the cell resistance of each memory cell that stores the data "0", Rp(1+MR) represents the cell resistance of each memory cell that stores the data "1", I represents the read current, and MR represents the MR ratio of the selected memory cell.

The operational amplifier OP controls the gate potential of a P-channel MOS transistor P4 so that the bias potential VBIAS to be supplied to the negative input node or the gate of the transfer transistor N1 shown in FIG. 3 becomes equal to VR+Vth. By doing so, the relationship that can be expressed as VBIAS=VR+Vth is established.

The relationship can be established by setting the threshold voltage Vth of the transfer transistor N1 of FIG. 3 and the threshold voltage Vth of the N-channel MOS transistor N2 in the VBIAS generator 12 at the same values. With the relationship being established, the transfer transistor N1 of FIG. 3 is automatically cutoff when the first read operation is to be performed.

A capacitance CL that is connected to the output node is a device that maintains the bias potential VBIAS (=VR+Vth) to be supplied to the gate of the transfer transistor N1 of FIG. 3, after putting the VBIAS generator 12 in a non-operating state. The capacitance CL holds the transfer transistor N1 of FIG. 3 cutoff until a second read operation starts.

B. Operation of Read Circuit

Next, the operation of the read circuit according to the first embodiment will be described.

Figure 5:
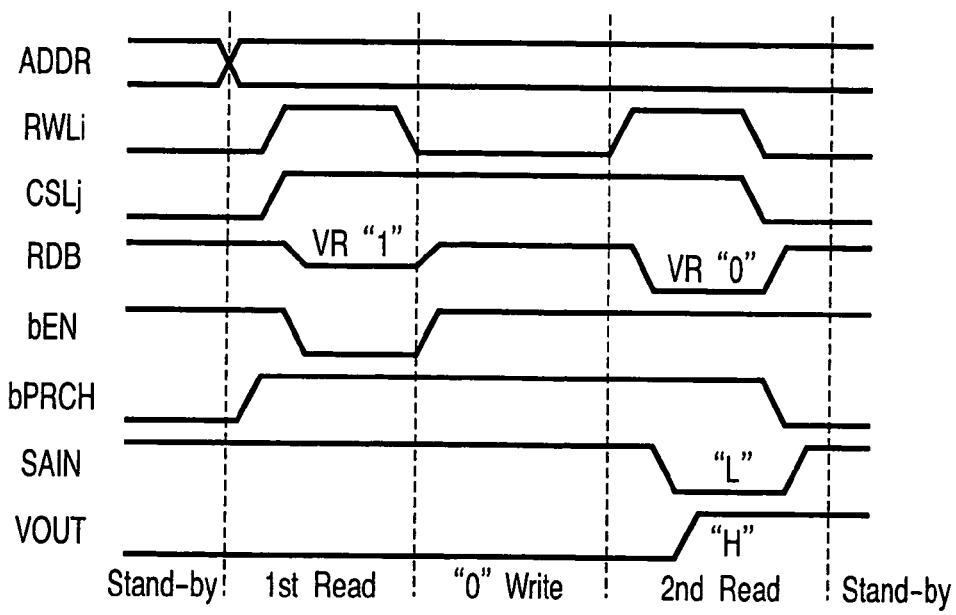
FIG. 5 is a waveform chart showing the operation timings of the read circuit of FIG. 3.
Figure 6:
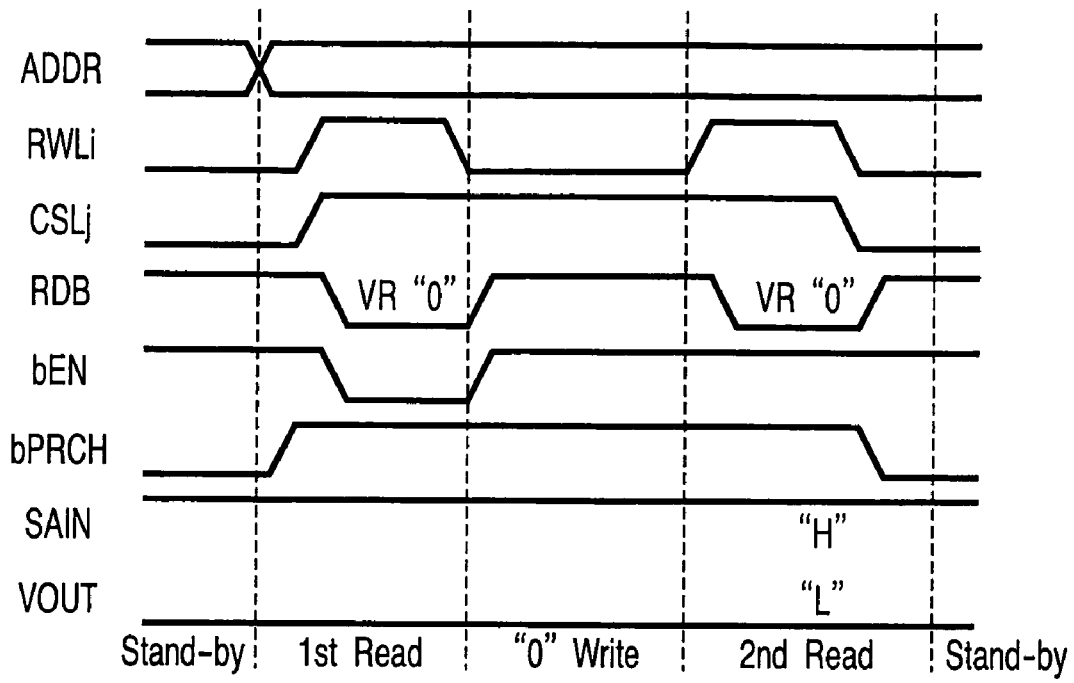
FIG. 6 is another waveform chart showing the operation timings of the read circuit of FIG. 3.

FIGS. 5 and 6 are waveform charts illustrating the operation timing in the read circuit shown in FIGS. 3 and 4.

When an address signal ADDR is input from the outside of the memory and the memory is activated, the first read operation starts.

More specifically, as the inversion signal bPRCH of the precharge signal PRCH becomes "H", the precharging of the read data input node SAIN of the sense amplifier SA is released. Here, the input node SAIN is set to the supply potential VCC. With the supply potential VCC, the input node SAIN is put in a floating state.

Based on the address signal ADDR, a memory cell to be read is selected. The read word line RWLi is set "H" and is activated, and the column selecting line CSLj is also set "H" and is activated. At this point, the constant current I as a read current is supplied from the constant current circuit to the selected memory cell to be read. Accordingly, the read potential VR read out from the selected memory cell is read into the read data bus RDB.

As a result, the potential of the read data bus RDB drops from the supply potential VCC to the read potential VR corresponding to the data stored in the selected memory cell.

In the example shown in FIG. 5, the data stored in the selected memory cell is "1", and accordingly, the potential of the read data bus RDB is VR"1" (=Rp(1+MR)×I). In the example shown in FIG. 6, the data stored in the selected memory cell is "0", and accordingly, the potential of the read data bus RDB is VR"0" (=Rp×I).

As the inversion signal bEN of the enable signal EN then becomes "L", the VBIAS generator 12 is put in an operating state and outputs the bias potential VBIAS.

In the case where the data stored in the selected memory cell is "1", the read data bus RDB exhibits VR"1" (=Rp(1+MR)×I). Accordingly, the bias potential VBIAS becomes VR"1"+Vth, and the transfer transistor N1 shown in FIG. 3 is cutoff.

In the case where the data stored in the selected memory cell is "0", the read data bus RDB exhibits VR"0" (=Rp×I). Accordingly, the bias potential VBIAS becomes VR"0"+Vth, and the transfer transistor N1 shown in FIG. 3 is cutoff.

As the inversion signal bEN of the enable signal EN then becomes "H" and the VBIAS generator 12 is put in a non-operating state, the output node of the VBIAS generator 12 is put in a high-impedance state. As a result, by virtue of the capacitance CL shown in FIG. 4, the bias potential VBIAS is maintained at the gate of the transfer transistor N1 shown in FIG. 3, and the transfer transistor N1 shown in FIG. 3 remains cutoff.

When the read word line RWLi is turned "L" and is inactivated, the read current I flowing through the selected memory cell is shut off, and the read data bus RDB is charged by the constant current circuit to rise to the supply potential VCC.

In the above manner, the first read operation is completed.

A write operation is next performed. In this embodiment, an N-channel MOS transistor is employed for the transfer transistor N1 of FIG. 3. Therefore, "0" is written in the selected memory cell to be read ("0" Write).

Next, the operation moves on to a second read operation (2nd Read) that is characteristic of the self-reference sensing technique.

As in the first read operation, the read word line RWLi is first turned "H" and is activated in the second read operation. Since the column selecting line CSLj remains "H" after it is turned "H" in the first read operation, the constant current I as the read current is supplied from the constant current circuit to the selected memory cell. As a result, the read potential VR read out from the selected memory cell is read into the read data bus RDB.

According to the self-reference sensing technique of this embodiment, the inversion signal bEN of the enable signal EN is not turned "L" but remains "H", unlike the inversion signal bEN in the first read operation. Also, the VBIAS generator 12 remains in the non-operating state. The read current I that is the same as the read current used in the first read operation is supplied to the selected memory cell.

As a result, the potential of the read data bus RDB drops from the supply potential VCC to the read potential VR corresponding to the data stored in the selected memory cell.

In the second read operation, the data stored in the selected memory cell is "0", which has been set in the write operation. Accordingly, the potential of the read data bus RDB is VR"0" (=Rp×I).

In the case where the data read out during the first read operation is "1", the voltage between the gate and source of the transfer transistor N1 of FIG. 3 is Vth (=VBIAS−VR"1") before the second read operation is performed. Accordingly, when the potential of the read data bus RDB becomes VR"0", the voltage between the gate and source of the transfer transistor N1 of FIG. 3 becomes VBIAS−VR"0", which is greater than Vth (=VBIAS−VR"1").

As a result, the transfer transistor N1 of FIG. 3 is switched from cutoff to on. As shown in FIG. 5, the potential of the read data input node SAIN of the sense amplifier SA drops from the precharge potential VPR (the supply potential VCC, for example)="H" to VBIAS−VR"0"="L" at the lowest. Accordingly, the output signal VOUT of the sense amplifier SA becomes "H".

In the case where the data read out during the first read operation is "0", on the other hand, the voltage between the gate and source of the transfer transistor N1 of FIG. 3 is Vth (=VBIAS−VR"0") before the second read operation is performed. Accordingly, even if the read data bus RDB becomes VR"0", the voltage between the gate and source of the transfer transistor N1 of FIG. 3 is maintained at VBIAS−VR"0", and the transfer transistor N1 of FIG. 3 remains cutoff.

As a result, the read data input node SAIN of the sense amplifier SA maintains the precharge potential VPR (the supply potential VCC, for example)="H", as shown in FIG. 6. Accordingly, the output signal VOUT of the sense amplifier SA becomes "L".

A capacitance Ca connected to the read data input node SAIN of the sense amplifier SA is a device that serves to maintain the precharge potential VPR.

Since the capacitance Ca is sufficiently smaller than the capacitance Cr connected to the read data bus RDB, the input node SAIN is discharged at high speed where the data read out in the first read operation is "1".

C. Summary

As described above, in accordance with the first embodiment, if the data read out from a designated cell or a selected memory cell in the first read operation is equal to the data read out from the designated cell in the second read operation, the transfer transistor N1 of FIG. 3 is maintained cutoff. Thus, "the setting of a guard band for determining whether a signal difference exists" can be completely omitted.

According to the self-reference sensing technique, sufficiently great margins are allowed for "0"/"1" determination to be performed by the sense amplifier SA, without an adverse influence of the MR ratio of each magnetoresistive device. Thus, a semiconductor memory that exhibits high-speed performance and high reliability in read operations can be provided.

As the setting of a guard band can be omitted in this embodiment, the sense amplifier SA determines whether the input node SAIN has the precharge potential VPR or the read potential (signal) VR"0" read out from a designated cell that stores "0". In short, the circuit threshold value of the sense amplifier SA is set to (VPR−VR"0")/2 so that the margins allowed for the "0"/"1" determination become uniform.

Figure 7:
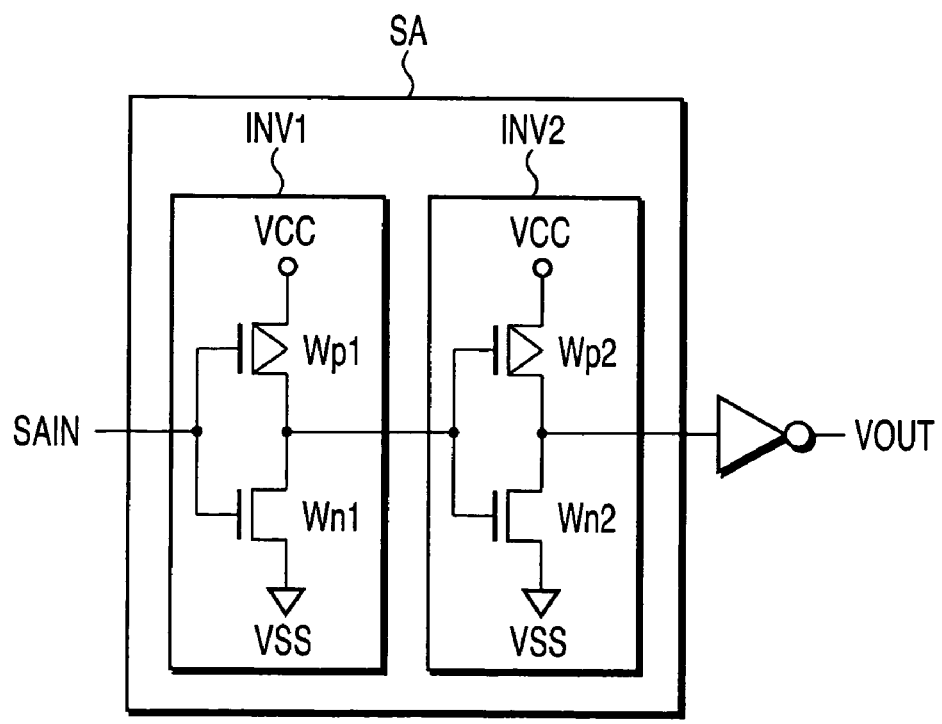
FIG. 7 is a circuit diagram illustrating an example of a sense amplifier SA.

FIG. 7 shows an example circuit configuration of the sense amplifier SA.

The input node SAIN of the sense amplifier SA is precharged to the precharge potential VPR (the supply potential VCC, for example) during a standby mode, and drops to the read potential VR"0" (the ground potential VSS<VR"0" (the intermediate potential)<the supply potential VCC) only in the case where the data read out from the selected memory cell to be read is "1" in the second read operation.

Accordingly, the sense amplifier SA may be formed with a series inverter circuit that includes a first inverter INV1 having a logical threshold value greater than half of the supply potential VCC, and a second inverter INV2 having a logical threshold value in the neighborhood of half of the supply potential VCC.

The logical threshold value of each of the inverters INV1 and INV2 is adjusted by controlling the size (the driving power) of the P-channel MOS transistor and the N-channel MOS transistor.

To obtain a logical threshold value suitable for the first inverter INV1, the gate width Wp1 of the P-channel MOS transistor is made three or more times as great as the gate width Wn1 of the N-channel MOS transistor. To obtain a logical threshold value suitable for the second inverter INV2, the gate width Wp2 of the P-channel MOS transistor is made approximately twice as great as the gate width Wn2 of the N-channel MOS transistor.

This sense amplifier SA is merely an example, and a sense amplifier of any other type, such as an operational amplifier, may also be employed.

(2) Second Embodiment

A second embodiment of the present invention is a modification of the first embodiment, and is characterized by the constant current circuit that generates the read current I during a read operation.

In the first embodiment, a magnetic random access memory that supplies the read current I from the constant current circuit to the memory cells in the first and second read operations is employed. In the second embodiment, on the other hand, a magnetic random access memory that supplies the read current I from the memory cells to the constant current circuit in the first and second read operations is employed.

A. Read Circuit

Figure 8:
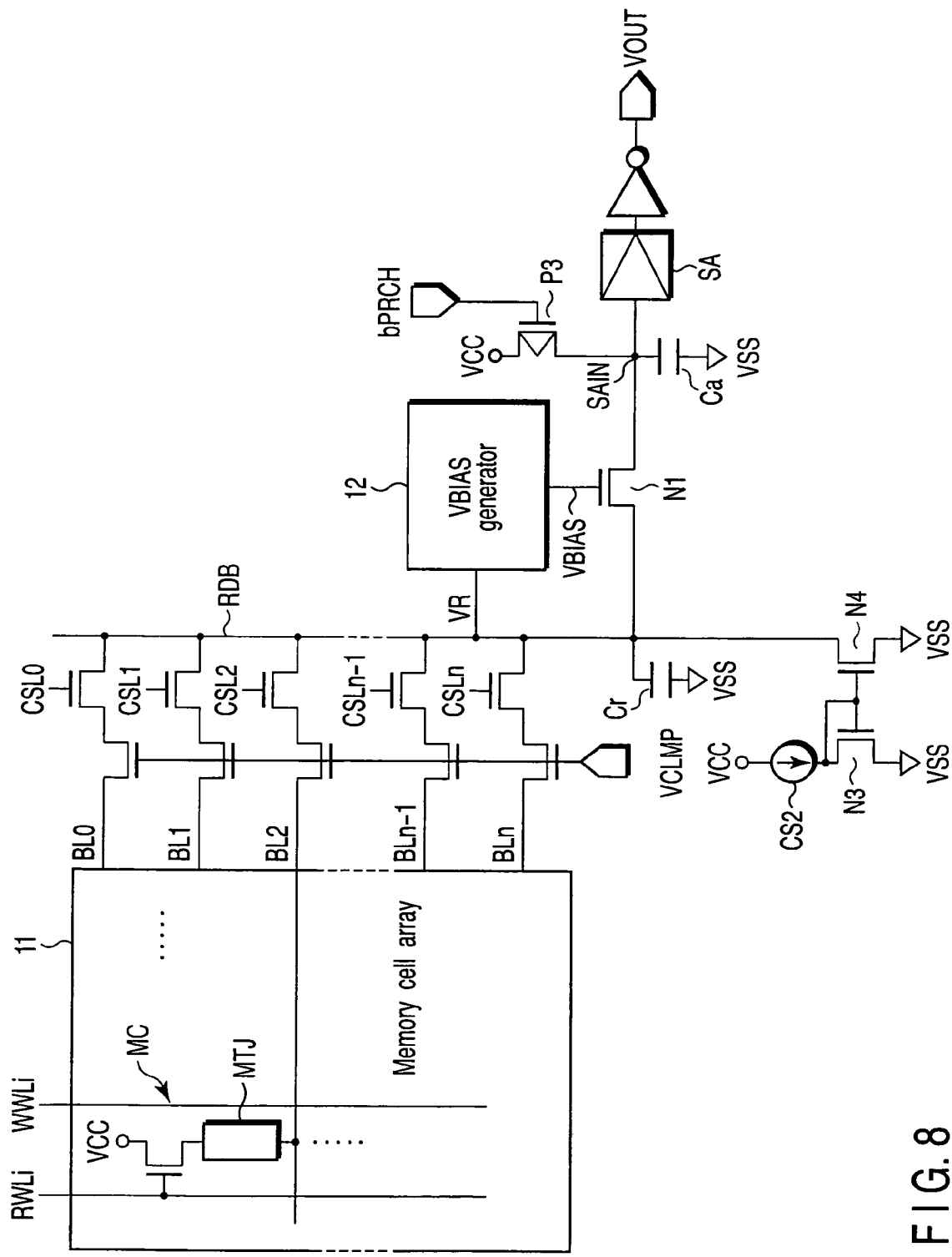
FIG. 8 is a circuit diagram illustrating a read circuit according to a second embodiment of the present invention.

FIG. 8 illustrates a read circuit of a magnetic random access memory according to the second embodiment of the present invention.

A memory cell array 11 includes memory cells MC that are arranged in an array. As in the first embodiment, each of the memory cells MC is of the 1TR-1MTJ type. However, the flowing direction of the read current I in this embodiment is opposite from the flowing direction of the read current I in the first embodiment. Therefore, the supply potential VCC, instead of the ground potential VSS, is applied to the memory cell MC at one end of the array of the memory cells MC.

A read word line RWLi is connected to the gate of the read selecting transistor of the memory cells MC, and a bit line BLj (j=0, 1, 2, ... n−1, n) is connected to one end of the MTJ device of each memory cell MC.

When the read word line RWLi is activated and becomes "H" at the time of a read operation, for example, all the data stored in the memory cells MC in the single row connected to the read word line RWLi are read out to the bit lines BLj (j=0, 1, 2, ... n−1, n).

When one of column selecting lines CSLj (j=0, 1, 2, ... n−1, n) is selectively activated, only the data stored in the memory cell (designated cell) MC selected to be read are transferred to a read data bus RDB.

The N-channel MOS transistors each having a clamp signal VCLMP input to its gate are clamping circuits that clamp the respective bit lines BLj (j=0, 1, 2, ... n−1, n) at a constant voltage.

A constant current circuit is connected to one end of the read data bus RDB. The constant current circuit includes a constant current source CS2 that generates the constant current I, and a current mirror circuit that reads and copies the constant current I, and supplies the copy current to the read data bus RDB. The current mirror circuit includes N-channel MOS transistors N3 and N4.

At the time of a read operation, the constant current I as a read current flows from the selected memory cell MC to the constant current circuit. Here, the data stored in the selected memory cell MC, or the read potential (signal) VR corresponding to the magnetoresistance of the MTJ device of the selected memory cell MC, is read out to the read data bus RDB.

A sensing circuit is connected to the other end of the read data bus RDB. As in the first embodiment, a transfer transistor N1 that characterizes this embodiment is connected between the read data bus RDB and a sense amplifier SA. The transfer transistor N1 is formed with an N-channel MOS transistor that has a gate connected to a VBIAS generator 12.

Based on the read potential VR read into the read data bus RDB in a first read operation, the VBIAS generator 12 sets the gate of the transfer transistor N1 at VBIAS (=VR+Vth), thereby putting the transfer transistor N1 cutoff. Here, Vth represents the threshold voltage of the transfer transistor N1.

An inversion signal bPRCH of a precharge signal PRCH is input to the gate of a P-channel MOS transistor P3. When the inversion signal bPRCH of the precharge signal PRCH becomes "L", the P-channel MOS transistor P3 is turned on, and the input node SAIN is precharged to the precharge potential VPR.

As in the first embodiment, the circuit shown in FIG. 4 can be employed as the VBIAS generator 12.

B. Operation of Read Circuit

Next, the operation of the read circuit according to the second embodiment will be described.

Figure 9:
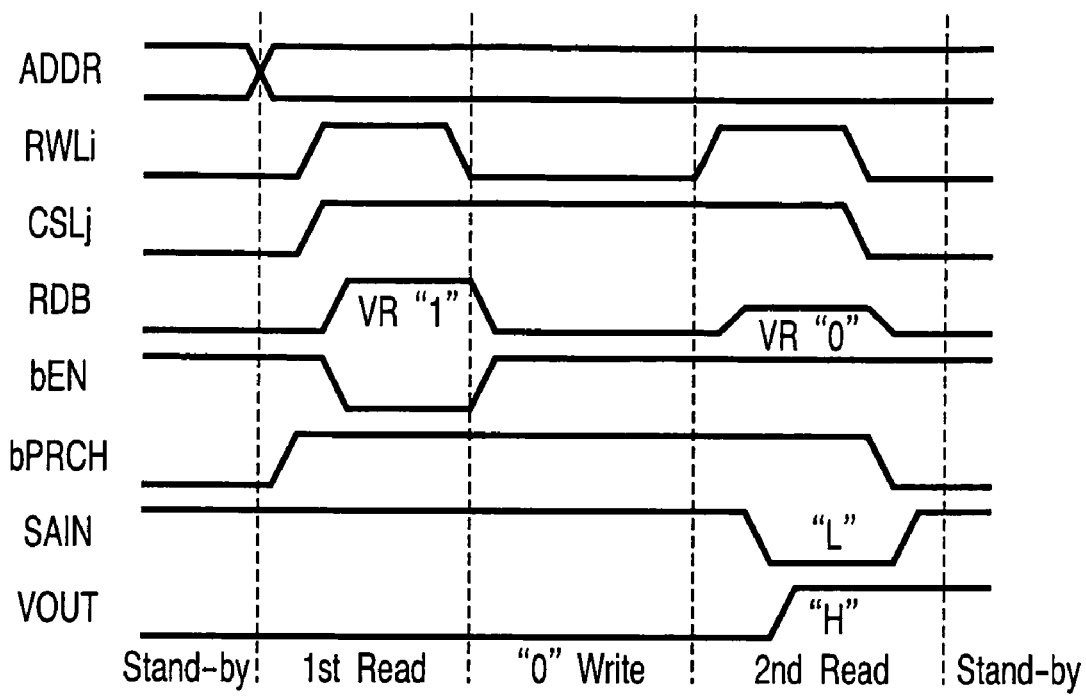
FIG. 9 is a waveform chart showing the operation timings of the read circuit of FIG. 8.
Figure 10:
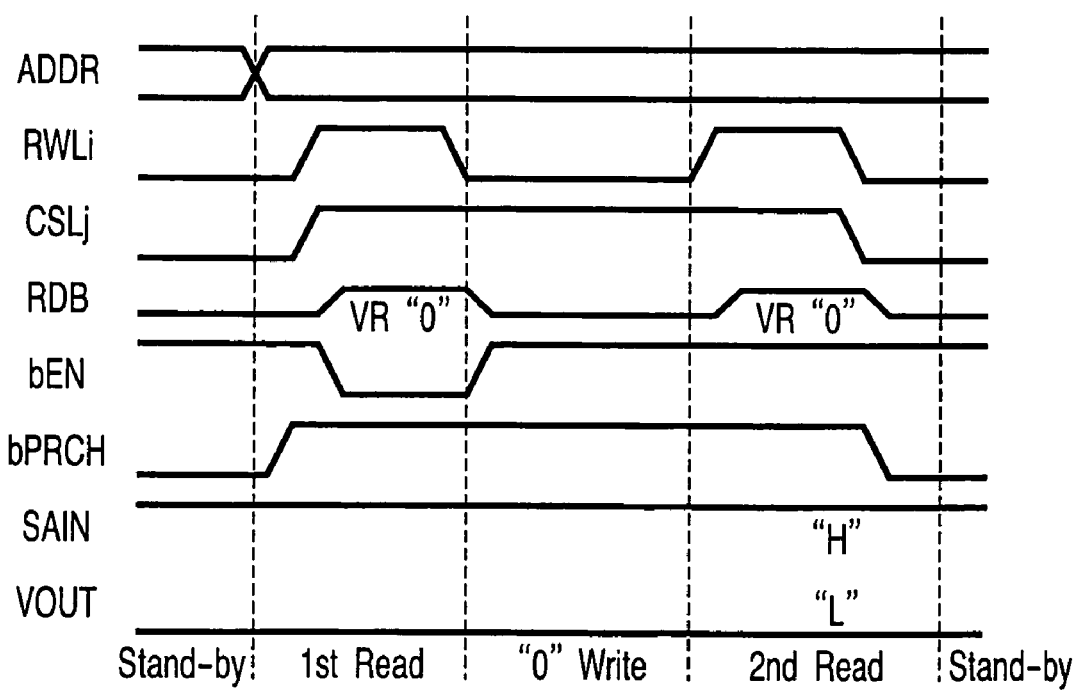
FIG. 10 is another waveform chart showing the operation timings of the read circuit of FIG. 8.

FIGS. 9 and 10 are waveform charts illustrating the operation timings in the read circuit shown in FIG. 8. The VBIAS generator 12 of this embodiment is the circuit shown in FIG. 4.

The operation of the read circuit according to the second embodiment is the same as the operation according to the first embodiment, except that the read data bus RDB has the ground potential VSS during a standby mode (Stand-by) and a write operation ("0" Write). Therefore, explanation of the operation of the read circuit according to the second embodiment is omitted herein.

C. Summary

In the second embodiment, if the data read out from a designated cell or a selected memory cell in the first read operation is equal to the data read out from the designated cell in the second read operation, the transfer transistor N1 of FIG. 8 remains cutoff. Thus, "the setting of a guard band for determining whether a signal difference exists" can be completely omitted.

According to the self-reference sensing technique, sufficiently great margins are allowed for "0"/"1" determination to be performed by the sense amplifier SA, without an adverse influence of the MR ratio of each magnetoresistive device. Thus, a semiconductor memory that exhibits high-speed performance and high reliability in read operations can be provided.

The sense amplifier SA of this embodiment is shown in FIG. 7, but is not limited to this configuration.

(3) Third Embodiment

A third embodiment of the present invention is also a modification of the first embodiment. The third embodiment is characterized by a transfer transistor that is cutoff during the first read operation and is turned on in the second read operation if the data read out in the second read operation differs from the data read out in the first embodiment.

In other words, in the first embodiment, the transfer transistor N1 is formed with an N-channel MOS transistor, and performs "0" write in the write operation according to the self-reference sensing technique. In the third embodiment, on the other hand, a transfer transistor is formed with a P-channel MOS transistor, and performs "1" write in the write operation according to the self-reference sensing technique.

As the transfer transistor is formed with a P-channel MOS transistor, the configuration of the VBIAS generator 12 and the operation of the read circuit according to the third embodiment are different from those according to the first embodiment. In the following, the read circuit including the VBIAS generator 12 and the operation of the read circuit are described in detail.

A. Read Circuit

Figure 11:
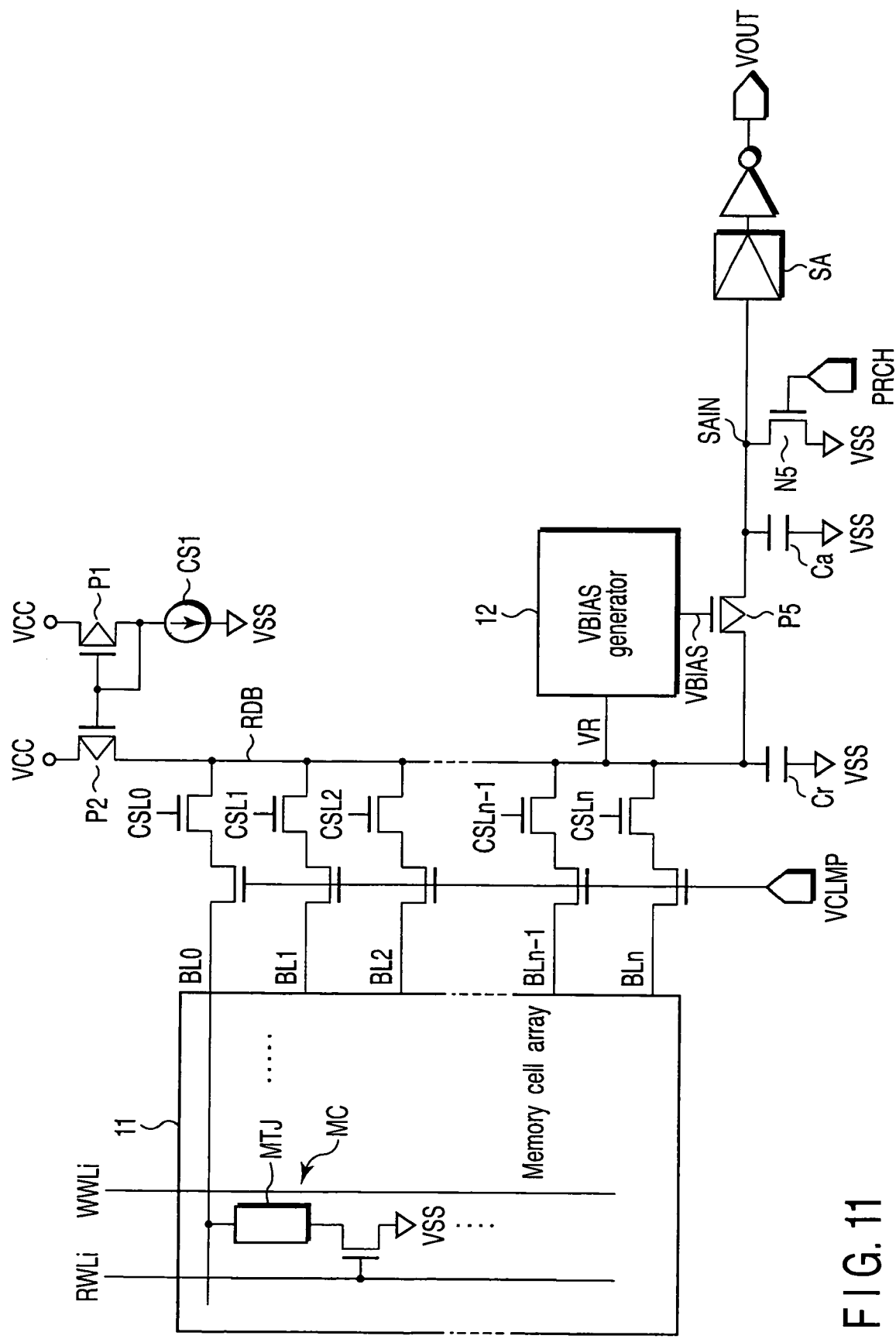
FIG. 11 is a circuit diagram illustrating a read circuit according to a third embodiment of the present invention.

FIG. 11 illustrates a read circuit of a magnetic random access memory according to the third embodiment of the present invention.

A memory cell array 11 includes memory cells MC that are arranged in an array. The memory cells MC may be two-dimensionally or three-dimensionally arranged on a semiconductor substrate. Each of the memory cells MC includes a MTJ device (a magnetoresistive device) MTJ.

In this embodiment, each of the memory cells MC is of the 1TR-1MTJ type that includes a transistor and a MTJ device. However, the memory cells MC are not limited to this type.

A read word line RWLi is connected to the gate of the read selecting transistor of the memory cells MC, and a bit line BLj (j=0, 1, 2, ... n−1, n) is connected to one end of the MTJ device of each memory cell MC.

For example, when the read word line RWLi is activated and becomes "H" at the time of a read operation, all the data stored in the memory cells MC in the single row connected to the read word line RWLi are read out to the respective bit lines BLj (j=0, 1, 2, ... n−1, n).

When one of column selecting lines CSLj (j=0, 1, 2, ... n−1, n) is selectively activated, only the data stored in the memory cell (designated cell) MC selected to be read are transferred to a read data bus RDB.

The N-channel MOS transistors each having a clamp signal VCLMP input to its gate are clamping circuits that clamp the respective bit lines BLj (j=0, 1, 2, ... n−1, n) at a constant voltage.

The clamping circuits clamp the respective bit lines BLj (j=0, 1, 2, ... n−1, n) at a constant voltage during a read operation, so as to reduce the bias dependency exhibited in such a manner that the MR ratio of each MTJ device varies with the bias voltage applied to the MTJ device. With the bias dependency being reduced, variations in the read margin among the memory cells MC are restricted.

A constant current circuit is connected to one end of the read data bus RDB. The constant current circuit includes a constant current source CS1 that generates a constant current I, and a current mirror circuit that reads and copies the constant current I, and supplies the copy current to the read data bus RDB. The current mirror circuit includes P-channel MOS transistors P1 and P2.

During a read operation, the constant current I as a read current flows from the constant current circuit to the selected memory cell MC. Here, the data stored in the selected memory cell MC, or the read potential (signal) VR corresponding to the magnetoresistance of the MTJ device of the selected memory cell MC, is read out to the read data bus RDB.

In this embodiment, the read data bus RDB is shared among the bit lines BLj (j=0, 1, 2, . . . n−1, n). The capacitance Cr represents the parasitic capacitance caused in the read data bus RDB, such as the line capacitance and the diffusion capacitance of column switches each having a gate connected to the corresponding column selecting line CSLj (j=0, 1, 2, . . . n−1, n).

A sensing circuit is connected to the other end of the read data bus RDB. This embodiment is characterized in that a transfer transistor P5 is connected between the read data bus RDB and a sense amplifier SA.

In this embodiment, the transfer transistor P5 is formed with a P-channel MOS transistor that has a gate connected to the VBIAS generator 12.

Based on the read potential VR read into the read data bus RDB in the first read operation, the VBIAS generator 12 sets the gate of the transfer transistor P5 at VBIAS (=VR−Vth), thereby putting the transfer transistor P5 cutoff. Here, Vth represents the threshold voltage of the transfer transistor P5.

The source of the transfer transistor P5 is connected to the read data bus RDB, while the drain of the transfer transistor P5 is connected to the read data input node SAIN of the sense amplifier SA. Further, an N-channel MOS transistor N5 is connected to the input node SAIN. The N-channel MOS transistor N5 serves as a precharge circuit that precharges the input node SAIN to a precharge potential VPR (the ground potential VSS, for example) during a standby mode.

A precharge signal PRCH is input to the gate of the N-channel MOS transistor N5. When the precharge signal PRCH becomes "H", the N-channel MOS transistor N5 is turned on, and the input node SAIN is precharged to the precharge potential VPR.

FIG. 12 illustrates an example of the circuit configuration of the VBIAS generator 12 of the read circuit shown in FIG. 11.

The VBIAS generator 12 of this embodiment has a function of generating a bias potential VBIAS to turn the transfer transistor P5 shown in FIG. 11 cutoff, based on the read potential VR read out from the selected memory cell into the read data bus RDB.

In the first read operation, the VBIAS generator 12 invariably turns the transfer transistor P5 cutoff, even if there is a variation in the cell resistance among the memory cells that store identical data, and as a result, a difference is caused in the read potential VR to be read out from the memory cells storing the identical data to the read data bus RDB.

This operation is performed in the following manner.

When the first read operation is to be performed, the inversion signal bEN of an enable signal EN that is an activation signal for the VBIAS generator 12 is first turned "L". At this point, the VBIAS generator 12 is put in an operating state with the supply potential VCC.

As the first read operation is performed and the read data bus RDB has the read potential VR, a reference potential is input to the positive input node of an operational amplifier OP. The reference potential is a value (VR−Vth) obtained by subtracting the threshold voltage Vth of a P-channel MOS transistor P6 from the read potential VR.

Here, the read potential VR is expressed as Rp×I when the data stored in the selected memory cell is "0", and is expressed as Rp(1+MR)×I when the data stored in the selected memory cell is "1". In those expressions, Rp represents the cell resistance of each memory cell that stores the data "0", Rp(1+MR) represents the cell resistance of each memory cell that stores the data "1", I represents the read current, and MR represents the MR ratio of the selected memory cell.

The operational amplifier OP controls the gate potential of a P-channel MOS transistor P4 so that the bias potential VBIAS to be supplied to the negative input node or the gate of the transfer transistor P5 shown in FIG. 11 becomes equal to VR−Vth. By doing so, the relationship that can be expressed as VBIAS=VR−Vth is established.

The relationship can be established by setting the threshold voltage Vth of the transfer transistor P5 of FIG. 11 and the threshold voltage Vth of the N-channel MOS transistor P6 in the VBIAS generator 12 at the same values. With the relationship being established, the transfer transistor P5 of FIG. 11 is automatically cutoff when the first read operation is to be performed.

A capacitance CL that is connected to the output node is a device that maintains the bias potential VBIAS (=VR−Vth) to be supplied to the gate of the transfer transistor P5 of FIG. 11, after putting the VBIAS generator 12 in a non-operating state. The capacitance CL holds the transfer transistor P5 of FIG. 11 cutoff until the second read operation starts.

B. Operation of Read Circuit

Next, the operation of the read circuit according to this embodiment will be described.

Figure 14:
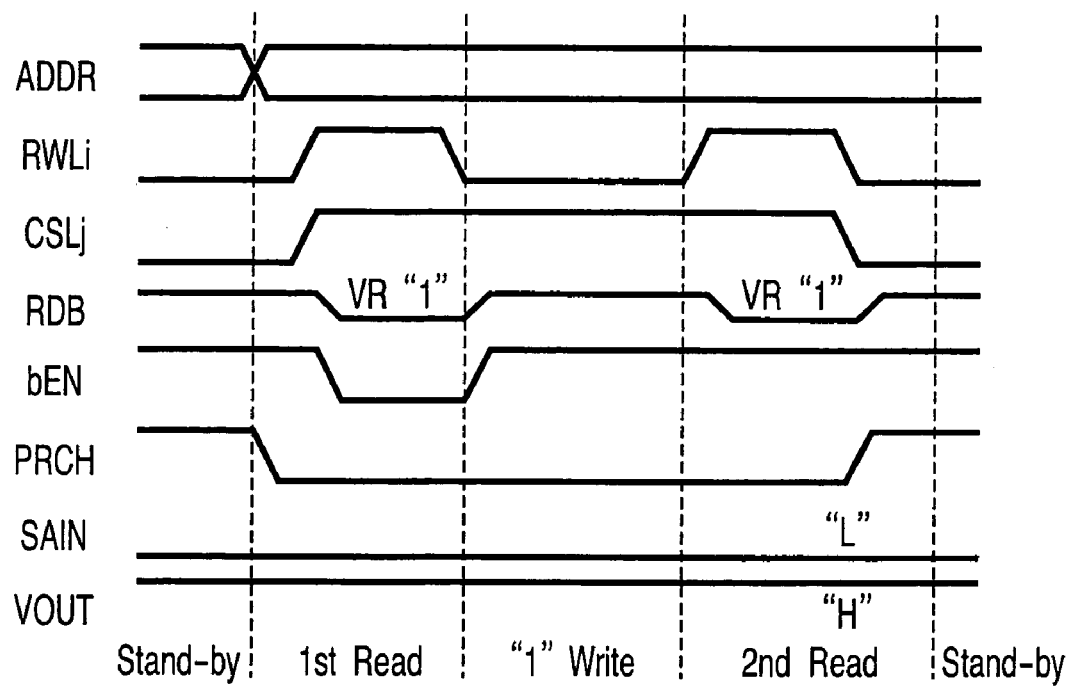
FIG. 14 is another waveform chart showing the operation timings of the read circuit of FIG. 11.

FIGS. 13 and 14 are waveform charts illustrating the operation timings in the read circuit shown in FIGS. 11 and 12.

When an address signal ADDR is input from the outside of the memory and the memory is activated, the first read operation (1st Read) starts.

More specifically, as the precharge signal PRCH becomes "L", the precharging of the read data input node SAIN of the sense amplifier SA is released. Here, the input node SAIN is set to the ground potential VSS. With the ground potential VSS, the input node SAIN is put in a floating state.

Subsequently, based on the address signal ADDR, a memory cell to be read is selected. The read word line RWLi is set "H" and is activated, and the column selecting line CSLj is also set "H" and is activated. At this point, the constant current I as a read current is supplied from the constant current circuit to the selected memory cell to be read. Accordingly, the read potential VR read out from the selected memory cell is read into the read data bus RDB.

As a result, the potential of the read data bus RDB drops from the supply potential VCC to the read potential VR corresponding to the data stored in the selected memory cell, for example.

In the example shown in FIG. 13, the data stored in the selected memory cell is "0", and accordingly, the potential of the read data bus RDB is VR"0" (=Rp×I). In the example shown in FIG. 14, the data stored in the selected memory cell is "1", and accordingly, the potential of the read data bus RDB is VR"1" (=Rp(1+MR)×I).

As the inversion signal bEN of the enable signal EN then becomes "L", the VBIAS generator 12 is put in an operating state and outputs the bias potential VBIAS.

In the case where the data stored in the selected memory cell is "0", the read data bus RDB exhibits VR"0" (=Rp×I). Accordingly, the bias potential VBIAS becomes VR"0"−Vth, and the transfer transistor PS shown in FIG. 11 is cutoff.

In the case where the data stored in the selected memory cell is "1", the read data bus RDB exhibits VR"1" (=Rp(1+MR)×I). Accordingly, the bias potential VBIAS becomes VR"1"−Vth, and the transfer transistor P5 shown in FIG. 11 is cutoff.

Thereafter, as the inversion signal bEN of the enable signal EN then becomes "H" and the VBIAS generator 12 is put in a non-operating state, the output node of the VBIAS generator 12 is put in a high-impedance state. As a result, by virtue of the capacitance CL shown in FIG. 12, the bias potential VBIAS is maintained at the gate of the transfer transistor P5 shown in FIG. 11, and the transfer transistor P5 remains cutoff.

When the read word line RWLi is turned "L" and is inactivated, the read current I flowing through the selected memory cell is shut off, and the read data bus RDB rises again to the supply potential VCC.

In the above manner, the first read operation is completed.

A write operation is next performed. In this embodiment, a P-channel MOS transistor is employed for the transfer transistor P5 of FIG. 11. Therefore, "1" is written in the selected memory cell to be read ("1" Write).

Next, the operation moves on to the second read operation (2nd Read) that is characteristic of the self-reference sensing technique.

As in the first read operation, the read word line RWLi is first turned "H" and is activated in the second read operation. Since the column selecting line CSLj remains "H" after it is turned "H" in the first read operation, the constant current I as the read current is supplied from the constant current circuit to the selected memory cell. As a result, the read potential VR read out from the selected memory cell is read into the read data bus RDB.

According to the self-reference sensing technique of this embodiment, the inversion signal bEN of the enable signal EN is not turned "L" but remains "H", unlike the inversion signal bEN in the first read operation. Also, the VBIAS generator 12 remains in the non-operating state. The read current I that is the same as the read current used in the first read operation is supplied to the selected memory cell.

As a result, the potential of the read data bus RDB drops from the supply potential VCC to the read potential VR corresponding to the data stored in the selected memory cell.

In the second read operation, the data stored in the selected memory cell is "1", which has been set in the write operation. Accordingly, the potential of the read data bus RDB is VR"1" (=Rp(1+MR)×I).

In the case where the data read out during the first read operation is "1", the voltage between the gate and source of the transfer transistor P5 of FIG. 11 is Vth (=VR"0"−VBIAS) before the second read operation is performed. Accordingly, when the potential of the read data bus RDB becomes VR"1", the voltage between the gate and source of the transfer transistor P5 of FIG. 11 becomes VR"1"−VBIAS, which is greater than Vth (=VR"0"−VBIAS).

As a result, the transfer transistor P5 of FIG. 11 is switched from cutoff to on. As shown in FIG. 13, the potential of the read data input node SAIN of the sense amplifier SA increases from the precharge potential VPR (the ground potential VSS, for example)="L" to VR"1"−VBIAS="H" at the highest. Accordingly, the output signal VOUT of the sense amplifier SA becomes "L".

In the case where the data read out during the first read operation is "1", on the other hand, the voltage between the gate and source of the transfer transistor P5 of FIG. 11 is Vth (=VR"1"−VBIAS) before the second read operation is performed. Accordingly, even if the read data bus RDB becomes VR"1", the voltage between the gate and source of the transfer transistor P5 of FIG. 11 is maintained at VR"1"−VBIAS, and the transfer transistor P5 of FIG. 11 remains cutoff.

As a result, the read data input node SAIN of the sense amplifier SA maintains the precharge potential VPR (the ground potential VSS, for example)="L", as shown in FIG. 14. Accordingly, the output signal VOUT of the sense amplifier SA becomes "H".

A capacitance Ca connected to the read data input node SAIN of the sense amplifier SA is a device that serves to maintain the precharge potential VPR.

Since the capacitance Ca is sufficiently smaller than the capacitance Cr connected to the read data bus RDB, the input node SAIN is charged at high speed where the data read out in the first read operation is "0".

C. Summary

As described above, in accordance with the third embodiment, if the data read out from a designated cell or a selected memory cell in the first read operation is equal to the data read out from the designated cell in the second read operation, the transfer transistor P5 of FIG. 11 is maintained cutoff. Thus, "the setting of a guard band for determining whether a signal difference exists" can be completely omitted.

According to the self-reference sensing technique, sufficiently great margins are allowed for "0"/"1" determination to be performed by the sense amplifier SA, without an adverse influence of the MR ratio of each magnetoresistive device. Thus, a semiconductor memory that exhibits high-speed performance and high reliability in read operations can be provided.

As the setting of a guard band can be omitted in this embodiment, the sense amplifier SA determines whether the input node SAIN has the precharge potential VPR or the read potential (signal) VR"1" read out from a designated cell that stores "1". In short, the circuit threshold value of the sense amplifier SA is set to (VR"1"−VPR)/2 so that the margins allowed for the "0"/"1" determination become uniform.

Figure 15:
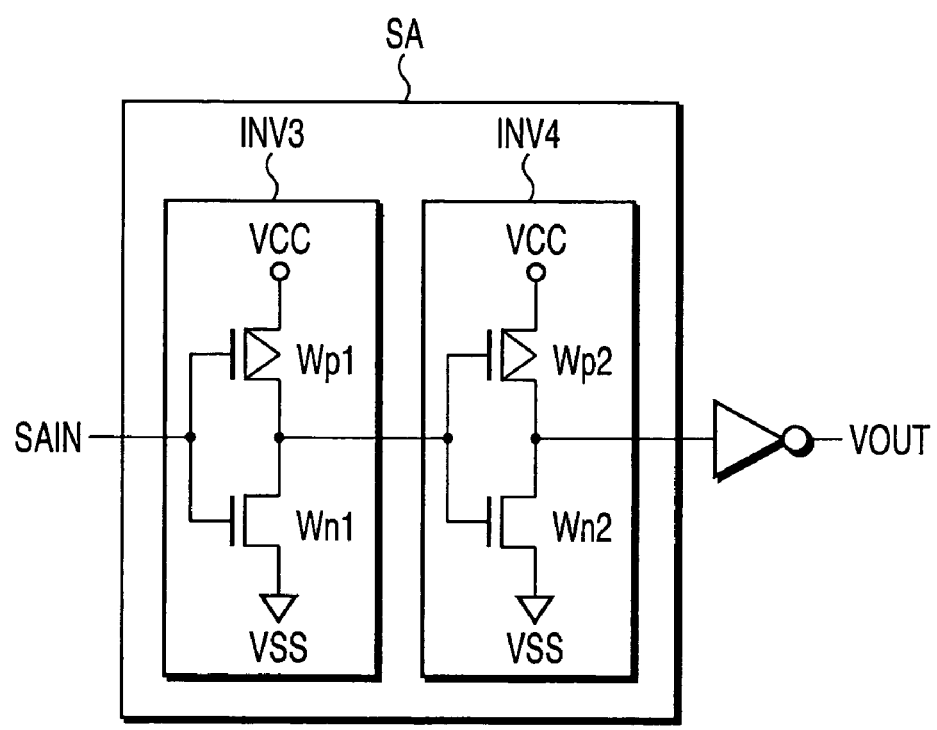
FIG. 15 is a circuit diagram illustrating an example of a sense amplifier SA.

FIG. 15 shows an example circuit configuration of the sense amplifier SA.

The input node SAIN of the sense amplifier SA is precharged to the precharge potential VPR (the ground potential VSS, for example) during a standby mode, and increases to the read potential VR"1" (the ground potential VSS<VR"1" (the intermediate potential)<the supply potential VCC) only in the case where the data read out from the selected memory cell to be read is "0" in the second read operation.

Accordingly, the sense amplifier SA may be formed with a series inverter circuit that includes a first inverter INV3 having a logical threshold value smaller than half of the supply potential VCC (closer to the ground potential VSS), and a second inverter INV4 having a logical threshold value in the neighborhood of half of the supply potential VCC.

The logical threshold value of each of the inverters INV3 and INV4 is adjusted by controlling the size (the driving power) of the P-channel MOS transistor and the N-channel MOS transistor.

To obtain a logical threshold value suitable for the first inverter INV3, the gate width Wn1 of the N-channel MOS transistor is made two or more times as great as the gate width Wp1 of the P-channel MOS transistor. To obtain a logical threshold value suitable for the second inverter INV4, the gate width Wn2 of the N-channel MOS transistor is made approximately half the gate width Wp2 of the P-channel MOS transistor.

This sense amplifier SA is merely an example, and a sense amplifier of any other type, such as an operational amplifier, may also be employed.

(4) Fourth Embodiment

A fourth embodiment of the present invention is a modification of the third embodiment, and is characterized by the constant current circuit that generates the read current I during a read operation.

In the third embodiment, a magnetic random access memory that supplies the read current I from the constant current circuit to the memory cells in the first and second read operations is employed. In the fourth embodiment, on the other hand, a magnetic random access memory that supplies the read current I from the memory cells to the constant current circuit in the first and second read operations is employed.

A. Read Circuit

Figure 16:
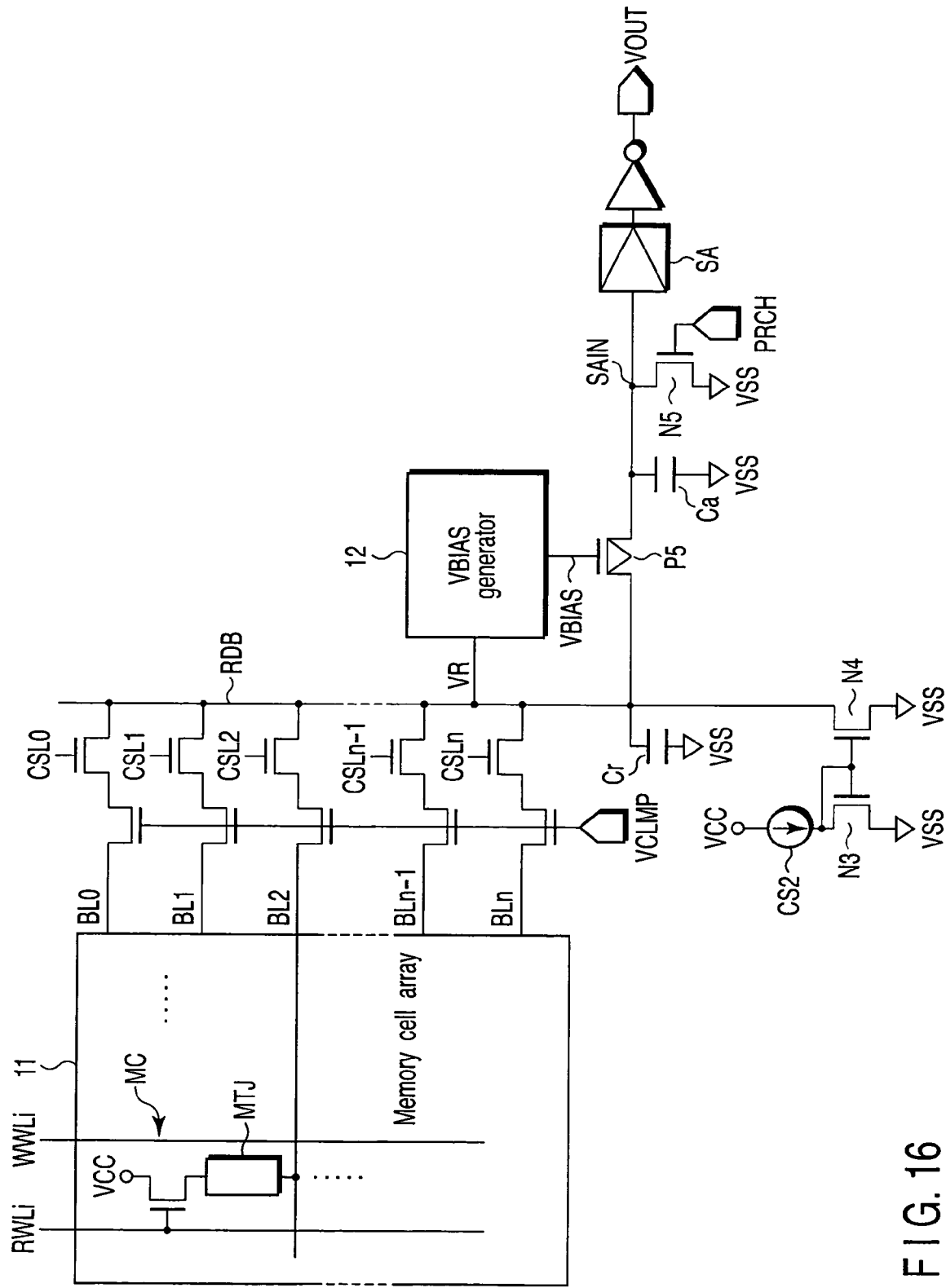
FIG. 16 is a circuit diagram illustrating a read circuit according to a fourth embodiment of the present invention.

FIG. 16 illustrates a read circuit of a magnetic random access memory according to the fourth embodiment of the present invention.

A memory cell array 11 includes memory cells MC that are arranged in an array. As in the third embodiment, each of the memory cells MC is of the 1TR-1MTJ type. However, the flowing direction of the read current I in this embodiment is opposite from the flowing direction of the read current I in the third embodiment. Therefore, the supply potential VCC, instead of the ground potential VSS, is applied to the memory cell MC at one end of the array of the memory cells MC.

A read word line RWLi is connected to the gate of the read selecting transistor of the memory cells MC, and a bit line BLj (j=0, 1, 2, . . . n−1, n) is connected to one end of the MTJ device of each memory cell MC.

When the read word line RWLi is activated and becomes "H" at the time of a read operation, for example, all the data stored in the memory cells MC in the single row connected to the read word line RWLi are read out to the respective bit lines BLj (j=0, 1, 2, . . . n−1, n).

When one of column selecting lines CSLj (j=0, 1, 2, . . . n−1, n) is selectively activated, only the data stored in the memory cell (designated cell) MC selected to be read are transferred to a read data bus RDB.

The N-channel MOS transistors each having a clamp signal VCLMP input to its gate are clamping circuits that clamp the respective bit lines BLj (j=0, 1, 2, . . . n−1, n) at a constant voltage.

A constant current circuit is connected to one end of the read data bus RDB. The constant current circuit includes a constant current source CS2 that generates the constant current I, and a current mirror circuit that reads and copies the constant current I, and supplies the copy current to the read data bus RDB. The current mirror circuit includes N-channel MOS transistors N3 and N4.

During a read operation, the constant current I as a read current flows from the selected memory cell MC to the constant current circuit. Here, the data stored in the selected memory cell MC, or the read potential (signal) VR corresponding to the magnetoresistance of the MTJ device of the selected memory cell MC, is read out to the read data bus RDB.

A sensing circuit is connected to the other end of the read data bus RDB. As in the third embodiment, a transfer transistor P5 that characterizes this embodiment is connected between the read data bus RDB and a sense amplifier SA. The transfer transistor P5 is formed with a P-channel MOS transistor that has a gate connected to a VBIAS generator 12.

Based on the read potential VR read into the read data bus RDB in a first read operation, the VBIAS generator 12 sets the gate of the transfer transistor P5 at VBIAS (=VR−Vth), thereby turning the transfer transistor P5 cutoff. Here, Vth represents the threshold voltage of the transfer transistor P5.

A precharge signal PRCH is input to the gate of an N-channel MOS transistor N5. When the precharge signal PRCH becomes "H", the N-channel MOS transistor N5 is turned on, and the input node SAIN is precharged to the precharge potential VPR.

As in the third embodiment, the circuit shown in FIG. 12 can be employed as the VBIAS generator 12.

B. Operation of Read Circuit

Next, the operation of the read circuit according to the fourth embodiment will be described.

FIGS. 17 and 18 are waveform charts illustrating the operation timings in the read circuit shown in FIG. 16. The VBIAS generator 12 of this embodiment is the same as the circuit shown in FIG. 12.

The operation of the read circuit according to the fourth embodiment is the same as the operation according to the third embodiment, except that the read data bus RDB has the ground potential VSS during a standby mode (Stand-by) and a write operation ("0" Write). Therefore, explanation of the operation of the read circuit according to the fourth embodiment is omitted herein.

C. Summary

Also in the fourth embodiment, if the data read out from a designated cell or a selected memory cell in the first read operation is equal to the data read out from the designated cell in the second read operation, the transfer transistor P5 of FIG. 16 remains cutoff. Thus, "the setting of a guard band for determining whether a signal difference exists" can be completely omitted.

According to the self-reference sensing technique, sufficiently great margins are allowed for "0"/"1" determination to be performed by the sense amplifier SA, without an adverse influence of the MR ratio of each magnetoresistive device. Thus, a semiconductor memory that exhibits high-speed performance and high reliability in read operations can be provided.

The sense amplifier SA of this embodiment is the same as the configuration shown in FIG. 15, but is not limited to it.

(5) Fifth Embodiment

With a read circuit of any of the above embodiments of the present invention, a read operation according to a novel self-reference sensing technique can be performed.

In the read operation according to the novel self-reference sensing technique, the write operation to be performed between the first and second read operations according to the conventional self-reference sensing technique is omitted. Instead, the second read operation is performed while a uniaxial magnetic field is generated in the memory cell. By doing so, the difference between the resistances of the selected memory cell obtained in the first and second read operations is detected to determine the data stored in the designated cell.

Figure 19:
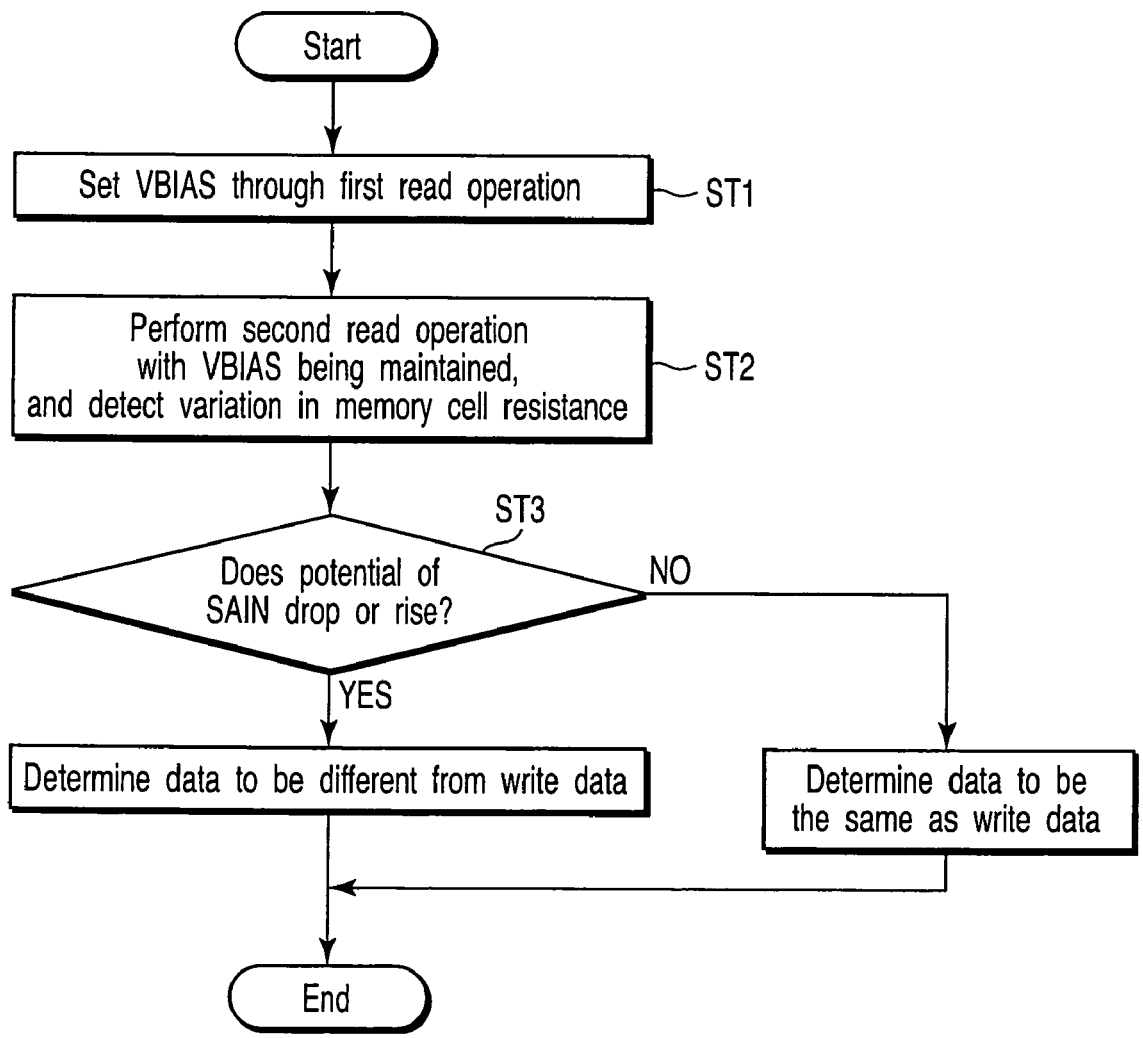
FIG. 19 is a flowchart of an operation to be performed according to a self-reference sensing technique of the present invention.

FIG. 19 is a flowchart of the operation according to the self-reference sensing technique of the present invention.

First, a bias potential VBIAS to be applied to the gate of a transfer transistor of the present invention is set through the first read operation (step ST1).

As a result, the transfer transistor is cutoff.

The procedures in the first read operation are the same as those of any of the first through fourth embodiments.

With the bias potential VBIAS being maintained, the second read operation is performed to detect a variation in the resistance of the selected memory cell (step ST2).

The second read operation of this embodiment is different from that of any of the first through fourth embodiments, and is performed as follows.

In the selected memory cell to be read, write (magnetization inversion) is not performed, but such a magnetic field as to cause a variation in the cell resistance with a change in the magnetic pattern is generated. The read current I is then applied to the selected memory cell, and the variation in the resistance of the selected memory cell is detected.

In the case where a write method utilizing a multi-axial magnetic field, such as a biaxial write method (including the toggle write method) or a triaxial write method, is employed, the magnetic field to be generated in the selected memory cell should be a uniaxial magnetic field directed in a certain axial direction.

In the case of a memory cell of the 1TR-1MTJ type employed in the first through fourth embodiments, for example, a write current is applied only to a write word line WWLi that is at a distance from the memory cell MC, to generate only a magnetic field Hx in the x-axis direction. The read current I is then applied so as to detect a variation in the resistance of the selected memory cell (see FIGS. 3, 8, 11 and 16).

If there is not a difference between the memory cell resistance detected in the first read operation and the memory cell resistance detected in the second read operation, the data stored in the selected memory to be read can be determined to be the same as the write data. Meanwhile, the transfer transistor remains cutoff.

Accordingly, in the case where there is not a difference between the memory cell resistance detected in the first read operation and the memory cell resistance detected in the second read operation, and the potential of the input node SAIN of the sense amplifier does not drop or rise, the data stored in the memory cell is determined to be the same as the write data: "0" in the first and second embodiments, and "1" in the third and fourth embodiments (step ST3).

In the case where there is a difference between the memory cell resistance detected in the first read operation and the memory cell resistance detected in the second read operation, the data stored in the selected memory cell to be read is determined to be different from the write data. In such a case, the transfer transistor is switched from cutoff to on.

Accordingly, in the case where there is a difference between the memory cell resistance detected during the first read operation and the memory cell resistance detected in the second read operation, and the potential of the input node SAIN of the sense amplifier drops or rises, the data stored in the memory cell is determined to be different from the write data: "1" in the first and second embodiments, and "0" in the third and fourth embodiments (step ST3).

According to the novel self-reference sensing technique, the number of steps can be reduced from the conventional four ("first read", "write", "second read", and "rewrite") to two ("first read" and "second read with a magnetic field being generated"). Thus, a magnetic random access memory that performs high-speed read operations can be achieved.

In the case where the direction of magnetization of the free layer of a MTJ device is parallel to the direction of magnetization of the pin layer of the MTJ device (the relationship being represented by "0", for example), the variation in the resistance caused by the uniaxial magnetic field is an increase in the resistance. In the case where the direction of magnetization of the free layer of the MTJ device is anti-parallel to the direction of magnetization of the pin layer of the MTJ device (the relationship being represented by "1", for example), the variation in the resistance caused by the uniaxial magnetic field is a decrease in the resistance.

The self-reference sensing technique according to the present invention can be applied to a magnetic random access memory that utilizes a toggle write method (see "A 4 Mbit 0.18 µm 1T1MTJ "Toggle" MRAM Memory", ISSCC Digest of Technical Papers, 2004).

4. Others

As described so far, according to the present invention, the provision of guard bands for determining whether the data obtained in the first and second read operations are the same can be omitted, and the read margins according to the self-reference sensing technique can be made greater than the conventional ones. Thus, a semiconductor memory that exhibits high-speed performance and high reliability in read operations can be provided. Also, according to the present invention, the novel self-reference sensing technique that does not require a write operation can be realized. Accordingly, the rewrite operation also becomes unnecessary. Thus, a semiconductor memory with even higher-speed performance can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A read circuit of a semiconductor memory, comprising:
   a sense amplifier which determines data stored in a memory cell based on a potential of an input node;
   a transfer transistor which is connected between the memory cell and the input node;
   a precharge circuit which sets the input node to a precharge potential; and
   a VBIAS generator which turns the transfer transistor cutoff based on a first signal obtained from the memory cell through a first read operation, wherein the transfer transistor is turned on when a second signal obtained from the memory cell through a second read operation differs from the first signal.

2. The read circuit according to claim 1, wherein the transfer transistor is an N-channel MOS transistor, and the precharge potential is a supply potential.

3. The read circuit according to claim 2, wherein, when the first and second signals differ from each other, the potential of the input node drops from the supply potential.

4. The read circuit according to claim 3, wherein the sense amplifier is configured by a series inverter circuit that includes a first inverter having a logical threshold value closer to the supply potential than to half of the supply potential, and a second inverter having a logical threshold value in the neighborhood of half of the supply potential.

5. The read circuit according to claim 1, wherein the transfer transistor is a P-channel MOS transistor, and the precharge potential is a ground potential.

6. The read circuit according to claim 5, wherein, when the first and second signals differ from each other, the potential of the input node rises from the ground potential.

7. The read circuit according to claim 6, wherein the sense amplifier is configured by a series inverter circuit that includes a first inverter having a logical threshold value closer to the ground potential than to half of the supply potential, and a second inverter having a logical threshold value in the neighborhood of half of the supply potential.

8. The read circuit according to claim 1, wherein the transfer transistor is a MOS transistor, and the VBIAS generator determines a gate potential based on the source potential of the MOS transistor and turns the transfer transistor cutoff.

9. The read circuit according to claim 8, wherein, during the first read operation, the transfer transistor is cutoff, irrespective of a variation in the data or characteristics of the memory cells.

10. The read circuit according to claim 8, wherein the source potential is generated according to the first signal.

11. The read circuit according to claim 8, wherein the gate potential determined by the VBIAS generator is maintained from the first read operation until the second read operation.

12. The read circuit according to claim 1, further comprising a constant current circuit which generates a read current for use in the first and second read operations.

13. The read circuit according to claim 12, wherein the read current flows from the constant current circuit to the memory cell.

14. The read circuit according to claim 12, wherein the read current flows from the memory cell to the constant current circuit.

15. The read circuit according to claim 1, wherein a write operation is performed on the memory cell between the first read operation and the second read operation, and when the transfer transistor is turned on, the potential of the input node changes from the precharge potential.

16. A read method using a self-reference sensing technique, comprising:
setting an input node of a sense amplifier to a precharge potential;
turning a transfer transistor cutoff, based on a first signal obtained from a memory cell through a first read operation, the transfer transistor being connected between the memory and the input node; and
turning the transfer transistor on and changing the potential of the input node from the precharge potential, when a second signal obtained from the memory cell through a second read operation differs from the first signal.

17. The read method according to claim 16, wherein the memory cell is a magnetoresistive device, and a magnetic field that is being applied to the magnetoresistive device is insufficient to cause magnetization inversion for the second read operation.

18. The read method according to claim 17, wherein the magnetic field is a uniaxial magnetic field directed in a particular axial direction, when the magnetization inversion is caused by combining magnetic fields directed in two or more axial directions.

19. The read method according to claim 17, wherein the magnetic field is generated from a write current that flows through one of write lines located in the vicinity of the memory cell.

20. The read method according to claim 17, the magnetization inversion is performed by a toggle write technique.

* * * * *